United States Patent
Jung et al.

(10) Patent No.: US 11,527,601 B2
(45) Date of Patent: Dec. 13, 2022

(54) ORGANIC LIGHT EMITTING DIODE DISPLAY DEVICE WITH REDUCED CONTACT RESISTANCE IN A CURRENT CONCENTRATION REGION

(71) Applicant: Samsung Display Co., Ltd., Yongin-si (KR)

(72) Inventors: Youngtaeg Jung, Busan (KR); Wonmi Hwang, Seoul (KR); Geurim Lee, Seoul (KR); Jaewon Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 16/817,260

(22) Filed: Mar. 12, 2020

(65) Prior Publication Data
US 2020/0388665 A1    Dec. 10, 2020

(30) Foreign Application Priority Data
Jun. 10, 2019    (KR) .................. 10-2019-0067672

(51) Int. Cl.
*H01L 27/32*    (2006.01)

(52) U.S. Cl.
CPC ........ *H01L 27/3276* (2013.01); *H01L 27/326* (2013.01)

(58) Field of Classification Search
CPC .......................... H01L 27/3276; H01L 27/326
USPC ..................................................... 257/40, 59
See application file for complete search history.

(56) References Cited

U.S. PATENT DOCUMENTS

| | | | |
|---|---|---|---|
| 2007/0085963 A1* | 4/2007 | Huang | G09G 3/3677 349/152 |
| 2009/0262292 A1* | 10/2009 | Lee | G02F 1/1345 349/149 |
| 2011/0254757 A1* | 10/2011 | Kim | G09G 3/3208 345/76 |
| 2015/0048320 A1* | 2/2015 | Lee | H01L 27/1255 257/40 |
| 2016/0181349 A1* | 6/2016 | Cho | H01L 27/3279 257/40 |
| 2018/0033821 A1* | 2/2018 | Kim | H01L 27/124 |
| 2018/0130856 A1* | 5/2018 | Kim | H01L 27/3218 |
| 2018/0158895 A1 | 6/2018 | Lee et al. | |

FOREIGN PATENT DOCUMENTS

KR    10-1913843 B1    11/2018

* cited by examiner

*Primary Examiner* — Lex H Malsawma
*Assistant Examiner* — Eric W Jones
(74) *Attorney, Agent, or Firm* — Lewis Roca Rothgerber Christie LLP

(57) ABSTRACT

An organic light emitting diode display device including a substrate having a display region, a peripheral region around the display region, and a pad region located on one side of the peripheral region, a sub-pixel structure in the display region on the substrate, a plurality of fan-out wires on the substrate and located in the peripheral region, each one of the fan-out wires including a first diagonal portion, a first straight portion, and a second diagonal portion, a first sub-power supply wire on the fan-out wires and located in the peripheral region, and a first planarization layer on the first sub-power supply wire and having an opening configured to expose the first sub-power supply wire on a portion at which the first straight portion of each of the fan-out wires is located.

20 Claims, 28 Drawing Sheets

ORGANIC LIGHT EMITTING DIODE DISPLAY DEVICE WITH REDUCED CONTACT RESISTANCE IN A CURRENT CONCENTRATION REGION

CROSS-REFERENCE TO RELATED APPLICATION

This application claims priority to and the benefit of Korean Patent Application No. 10-2019-0067672, filed on Jun. 10, 2019 in the Korean Intellectual Property Office (KIPO), the entire disclosure of which is incorporated herein by reference.

BACKGROUND

1. Field

Exemplary embodiments relate generally to an organic light emitting diode display device.

2. Description of the Related Art

Flat panel display devices are replacing cathode ray tube display devices as display devices due to their lightweight and thin characteristics. As representative examples of such flat panel display devices, there are liquid crystal display devices and organic light emitting diode display devices.

The organic light emitting diode display device may include a display region, a peripheral region surrounding (or around) the display region, and a pad region located on one side of the peripheral region. A plurality of pixel circuits and a plurality of organic light emitting diodes may be disposed in the display region, and a power supply wire and fan-out wires may be disposed in the peripheral region. In addition, pad electrodes may be disposed in the pad region. For example, the power supply wire may include a first sub-power supply wire and a second sub-power supply wire, a planarization layer may be disposed between the first sub-power supply wire and the second sub-power supply wire, and the fan-out wires may be disposed in the peripheral region (e.g., a first peripheral region) located between the display region and the pad region. In this case, a plurality of openings may be formed in the planarization layer so that the first sub-power supply wire and the second sub-power supply wire may make contact with each other through the openings on the fan-out wires. However, an interval between the fan-out wires may be relatively reduced to reduce an area of the first peripheral region, and when the second sub-power supply wire is disposed on the fan-out wires having the reduced interval, cracks may be generated in the second sub-power supply wire formed along a profile of the fan-out wires in the openings. Accordingly, the organic light emitting diode display device may become defective.

SUMMARY

Aspects of embodiments are directed to an organic light emitting diode display device.

According to some exemplary embodiments, there is provided an organic light emitting diode display device including: a substrate having a display region, a peripheral region around the display region, and a pad region located on one side of the peripheral region; a sub-pixel structure in the display region on the substrate; a plurality of fan-out wires on the substrate and located in the peripheral region, each one of the fan-out wires including a first diagonal portion, a first straight portion, and a second diagonal portion; a first sub-power supply wire on the fan-out wires and located in the peripheral region; and a first planarization layer on the first sub-power supply wire and having an opening configured to expose the first sub-power supply wire on a portion at which the first straight portion of each of the fan-out wires is located.

In some embodiments, the opening at least partially surrounds the display region.

In some embodiments, the organic light emitting diode display device of claim 1, further includes a second sub-power supply wire overlapping the first sub-power supply wire in the peripheral region and located on the first planarization layer, the second sub-power supply wire making contact with the first sub-power supply wire through the opening, wherein the first sub-power supply wire and the second sub-power supply wire constitute a power supply wire.

In some embodiments, the organic light emitting diode display device of claim 3, further includes a plurality of pad electrodes on the substrate and located in a portion of the pad region on the substrate, wherein the peripheral region includes: a first peripheral region between the pad region and the display region in correspondence with the pad electrodes; and a second peripheral region corresponding to a remaining portion of the peripheral region and located outside of the first peripheral region.

In some embodiments, the fan-out wires are in the first peripheral region and a portion of the second peripheral region.

In some embodiments, the first diagonal portion is adjacent to the pad electrodes, wherein the second diagonal portion is adjacent to the sub-pixel structure, wherein the first straight portion is located between the first and second diagonal portions, and wherein the first diagonal portion, the first straight portion, and the second diagonal portion are integrally formed.

In some embodiments, the power supply wire includes: a first wire portion adjacent to the pad electrodes in the first peripheral region and located on the substrate; and a second wire portion located in a portion of the first peripheral region and the second peripheral region and on the substrate, and wherein the power supply wire has a frame shape with an open bottom.

In some embodiments, the first and second wire portions are integrally formed, and wherein the first and second wire portions at least partially surround the display region.

In some embodiments, the opening is located along an outer profile of the second wire portion without being located in the first wire portion.

In some embodiments, the opening includes: a first opening at a first outer peripheral portion of the second wire portion that is adjacent to the first wire portion, the first opening having a first width; and a second opening at a second outer peripheral portion of the second wire portion that is not adjacent to the first wire portion, the second opening having a second width less than the first width.

In some embodiments, the first opening and the second opening are integrally formed.

In some embodiments, the fan-out wires include: first fan-out wires overlapping the first opening; and second fan-out wires overlapping the second opening, and wherein a length of the first straight portion in each of the first fan-out wires is longer than a length of the first straight portion in each of the second fan-out wires.

In some embodiments, each of the second fan-out wires further includes a second straight portion.

In some embodiments, the first diagonal portion of each of the second fan-out wires includes: an upper diagonal portion connected to the first straight portion; and a lower diagonal portion adjacent to the pad electrodes, wherein the second straight portion is between the upper diagonal portion and the lower diagonal portion, and wherein the upper diagonal portion, the second straight portion, and the lower diagonal portion are integrally formed.

In some embodiments, the sub-pixel structure includes: a lower electrode in the display region and located on the first planarization layer; a light emitting layer on the lower electrode; and an upper electrode on the light emitting layer, wherein a low power supply voltage is applied to the power supply wire, and wherein the low power supply voltage is provided to the upper electrode.

In some embodiments, a length of the first straight portion is shorter than a length of each of the first and second diagonal portions.

In some embodiments, at least two fan-out wires are under a portion overlapping with the opening in the peripheral region.

In some embodiments, the fan-out wires include first to $N^{th}$ fan-out wires (where N is an integer greater than or equal to 2), and a $K^{th}$ fan-out wire and a $(K+1)^{th}$ fan-out wire from among the first to $N^{th}$ fan-out wires are on mutually different layers (where K is an integer between 1 and N).

In some embodiments, the organic light emitting diode display device of claim 18, further includes: a semiconductor element in the display region and located between the substrate and the first planarization layer; connection and wiring patterns in the display region and located on the first planarization layer; a second planarization layer on the connection and wiring patterns; and a thin film encapsulation structure on the sub-pixel structure.

In some embodiments, the semiconductor element includes: an active layer on the substrate; a first gate electrode on the active layer; a second gate electrode on the first gate electrode; and source and drain electrodes on the second gate electrode, wherein the $K^{th}$ fan-out wire is at a same layer as the first gate electrode, wherein the $(K+1)^{th}$ fan-out wire is at a same layer as the second gate electrode, and wherein the first sub-power supply wire is at a same layer as the source and drain electrodes.

As the organic light emitting diode display device according to exemplary embodiments of the present invention includes fan-out wires, in which each of the fan-out wires includes a straight portion, the interval between the fan-out wires may be relatively increased. Accordingly, the opening is formed in the first planarization layer to overlap the straight portion, so that the first sub-power supply wire and the second sub-power supply wire may easily make contact with each other in the peripheral region without forming cracks on the second sub-power supply wire.

In addition, because the first opening located in the current concentration region has a relatively large area, a contact area of the first sub-power supply wire and the second sub-power supply wire is relatively increased, so that a contact resistance may be reduced, and the heat generation phenomenon may not occur in the current concentration region. Accordingly, a defect of the organic light emitting diode display device can be prevented or its likelihood substantially reduced.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
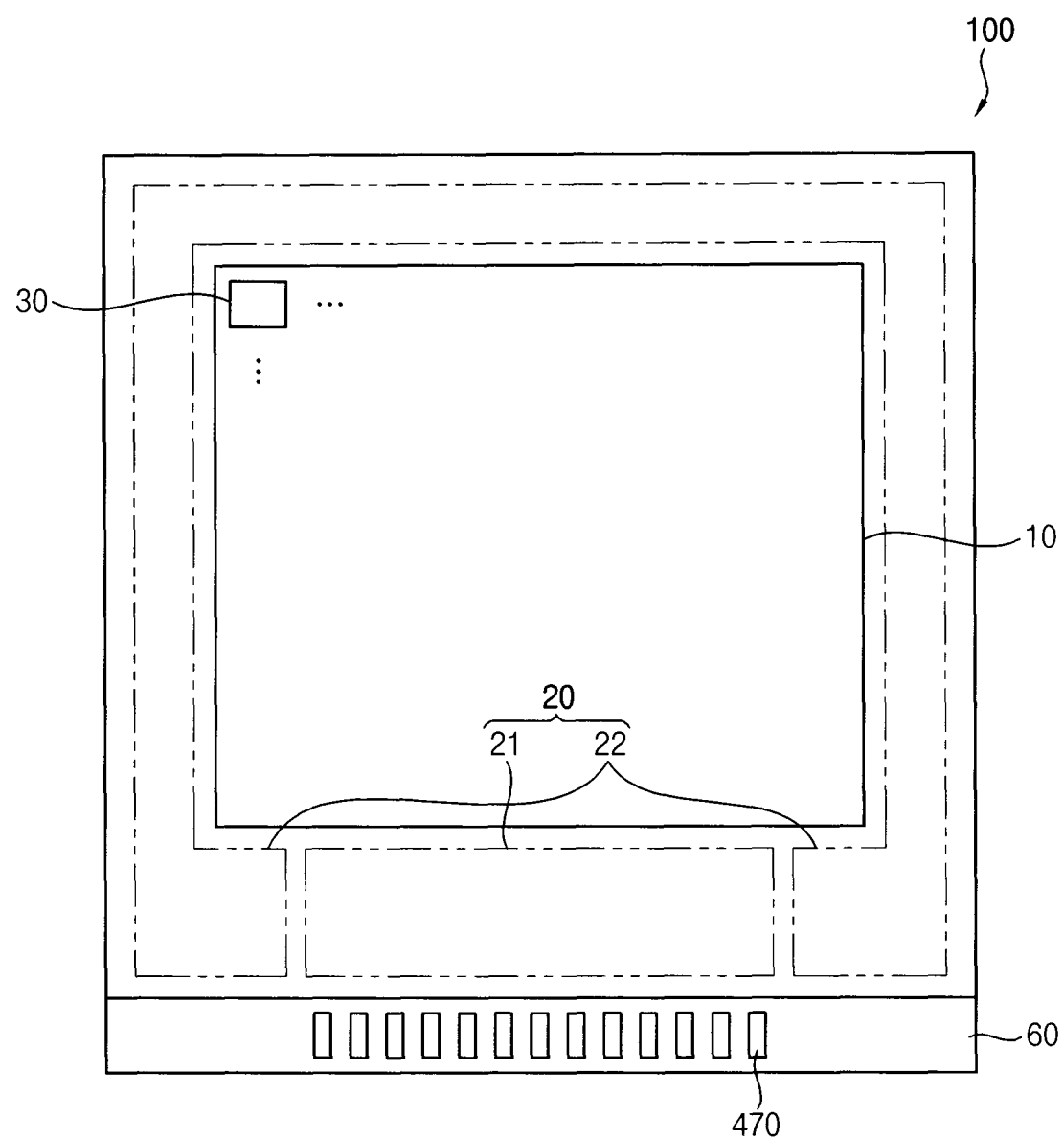
FIG. 1 is a plan view showing an organic light emitting diode display device according to some exemplary embodiments of the present invention.

Hereinafter, organic light emitting diode display devices and a method of manufacturing an organic light emitting diode display device according to some exemplary embodiments of the present invention will be described in detail with reference to the accompanying drawings. In the accompanying drawings, same or similar reference numerals refer to the same or similar elements.

FIG. 1 is a plan view showing an organic light emitting diode display device according to some exemplary embodiments of the present invention; FIGS. 2, 3, 4, and 5 are plan views for illustrating a power supply wire, fan-out wires, and an opening overlapping the power supply wire, which are included in the organic light emitting diode display device; FIG. 6 is a block diagram for illustrating an external device electrically connected to the organic light emitting diode display device of FIG. 1.

Referring to FIGS. 1, 2, 3, 4, 5, and 6, an organic light emitting diode display device 100 may include a power supply wire 350, fan-out wires 500, pad electrodes 470, and the like, and may include a display region 10, a peripheral region 20, and a pad region 60. In this case, as shown in FIG. 1, the peripheral region 20 may substantially surround (or be around) the display region 10 (or may at least partially surround or be around the display region 10) in a plan view, and the pad region 60 may be located on one side of the peripheral region 20. In addition, the display region 10 may include a plurality of sub-pixel circuit regions 30, and the peripheral region 20 may include a first peripheral region 21 and a second peripheral region 22. For example, the first peripheral region 21 may be located between the pad region 60 and the display region 10 in correspondence with the pad electrodes 470 disposed in the pad region 60. In addition, the second peripheral region 22 may correspond to a remaining portion of the peripheral region 20 outside of the first peripheral region 21. In other words, the first peripheral region 21 and the second peripheral region 22 may be different from each other, and may not overlap each other. For example, the peripheral region 20 may have a hollow rectangular shape (e.g., a rectangular frame shape) when viewed in a plan view. In other words, the peripheral region 20 may have a rectangular shape having an opening that exposes the display region 10 when viewed in a plan view.

In other exemplary embodiments, the organic light emitting diode display device 100 may further include a bending region. For example, the bending region may be located between the peripheral region 20 and the pad region 60. Connection electrodes configured to electrically connect the pad electrodes 470 to the fan-out wires 500 may be disposed in the bending region. As the bending region is bent, the pad region 60 may be located on a bottom surface of the organic light emitting diode display device 100. In other words, when the pad region 60 is located on the bottom surface of the organic light emitting diode display device 100, the bending region may have a curved shape.

The sub-pixel circuit regions 30 may be arranged over the display region 10. For example, each of the sub-pixel circuit regions 30 may be provided with a sub-pixel circuit SUB-PIXEL CIRCUIT (SPC) shown in FIG. 9 (e.g., semiconductor element 250 shown in FIGS. 10, 11, and 12), and an organic light emitting diode OLED (e.g., sub-pixel structure 200 shown in FIGS. 10, 11, and 12) may be disposed on the sub-pixel circuit SPC. An image may be displayed on the display region 10 through the sub-pixel circuit SPC and the organic light emitting diode OLED.

For example, first, second, and third sub-pixel circuits may be disposed in the sub-pixel circuit regions 30. The first sub-pixel circuit may be connected to a first organic light emitting diode that may emit a red light, the second sub-pixel circuit may be connected to a second organic light emitting diode that may emit a green light, and the third sub-pixel circuit may be connected to a third organic light emitting diode that may emit a blue light.

In exemplary embodiments, the first organic light emitting diode may overlap the first sub-pixel circuit, the second organic light emitting diode may overlap the second sub-pixel circuit, and the third organic light emitting diode may overlap the third sub-pixel circuit. In some embodiments, the first organic light emitting diode may overlap a portion of the first sub-pixel circuit and a portion of another sub-pixel circuit different from the first sub-pixel circuit, the second organic light emitting diode may overlap a portion of the second sub-pixel circuit and a portion of another sub-pixel circuit different from the second sub-pixel circuit, and the third organic light emitting diode may overlap a portion of the third sub-pixel circuit and a portion of another sub-pixel circuit different from the third sub-pixel circuit.

For example, the first to third organic light emitting diodes may be arranged by using an RGB stripe scheme in which rectangles having an identical size are arranged in order, an S-stripe scheme including a blue organic light emitting diode having a relatively large region, a WRGB scheme further including a white organic light emitting diode, a PenTile® scheme in which RG-GB patterns are repeatedly arranged, or any other suitable scheme known to those skilled in the art. Pentile® is a registered trademark of Samsung Display Co., Ltd.

In addition, at least one driving transistor, at least one switching transistor, at least one capacitor, and the like may be disposed in each of the sub-pixel circuit regions 30. In some exemplary embodiments, each of the sub-pixel circuit regions 30 may be provided with one driving transistor (e.g., first transistor TR1 of FIG. 9), six switching transistors (e.g., second to seventh transistors TR2, TR3, TR4, TRS, TR6, and TR7 of FIG. 9), and one storage capacitor (e.g., storage capacitor CST of FIG. 9).

Although each of the display region 10, the sub-pixel circuit region 30, and the pad region 60 of the present invention has been described as having a rectangular shape when viewed in a plan view, shapes of the display region 10, the sub-pixel circuit region 30, and the pad region 60 are not limited thereto, and any suitable shape may be utilized. For example, each of the display region 10, the sub-pixel circuit region 30, and the pad region 60 may have a triangular shape, a rhombic shape, a polygonal shape, a circular shape, a track shape, or an elliptical shape when viewed from a plan view.

A plurality of wires may be disposed in the peripheral region 20. For example, the wires may include a data signal wire, a gate signal wire, a light emission control signal wire, a gate initialization signal wire, an initialization voltage wire, a power supply voltage wire, and/or the like. The wires may extend from the peripheral region 20 to the display region 10 so as to be electrically connected to the sub-pixel circuit SPC and the organic light emitting diode OLED. In addition, a gate driver, a data driver, or the like may be disposed in the peripheral region 20.

Figure 2:
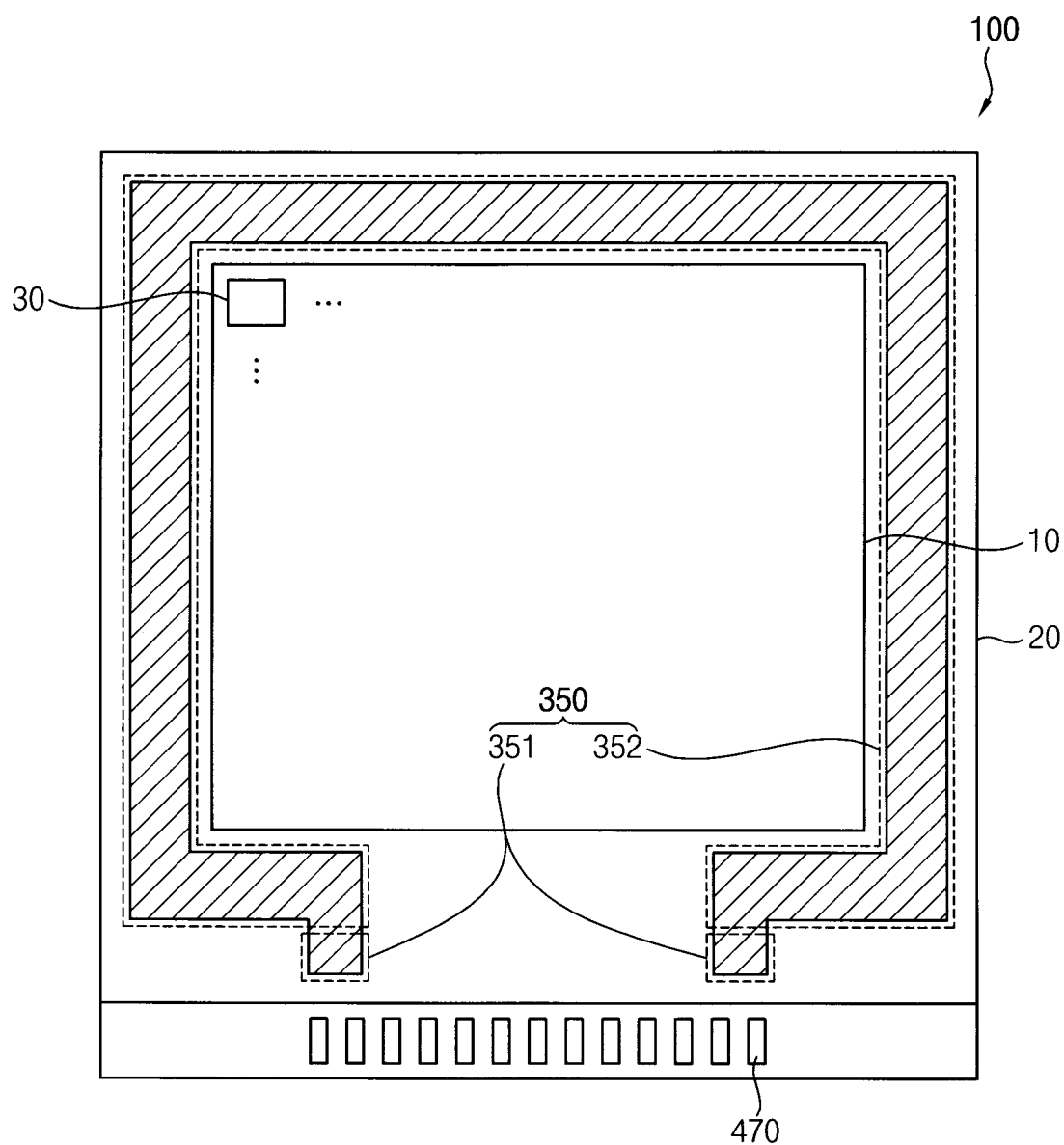
FIGS. 2-5 are plan views for illustrating a power supply wire, fan-out wires, and an opening overlapping the power supply wire, which are included in the organic light emitting diode display device.
Figure 4:
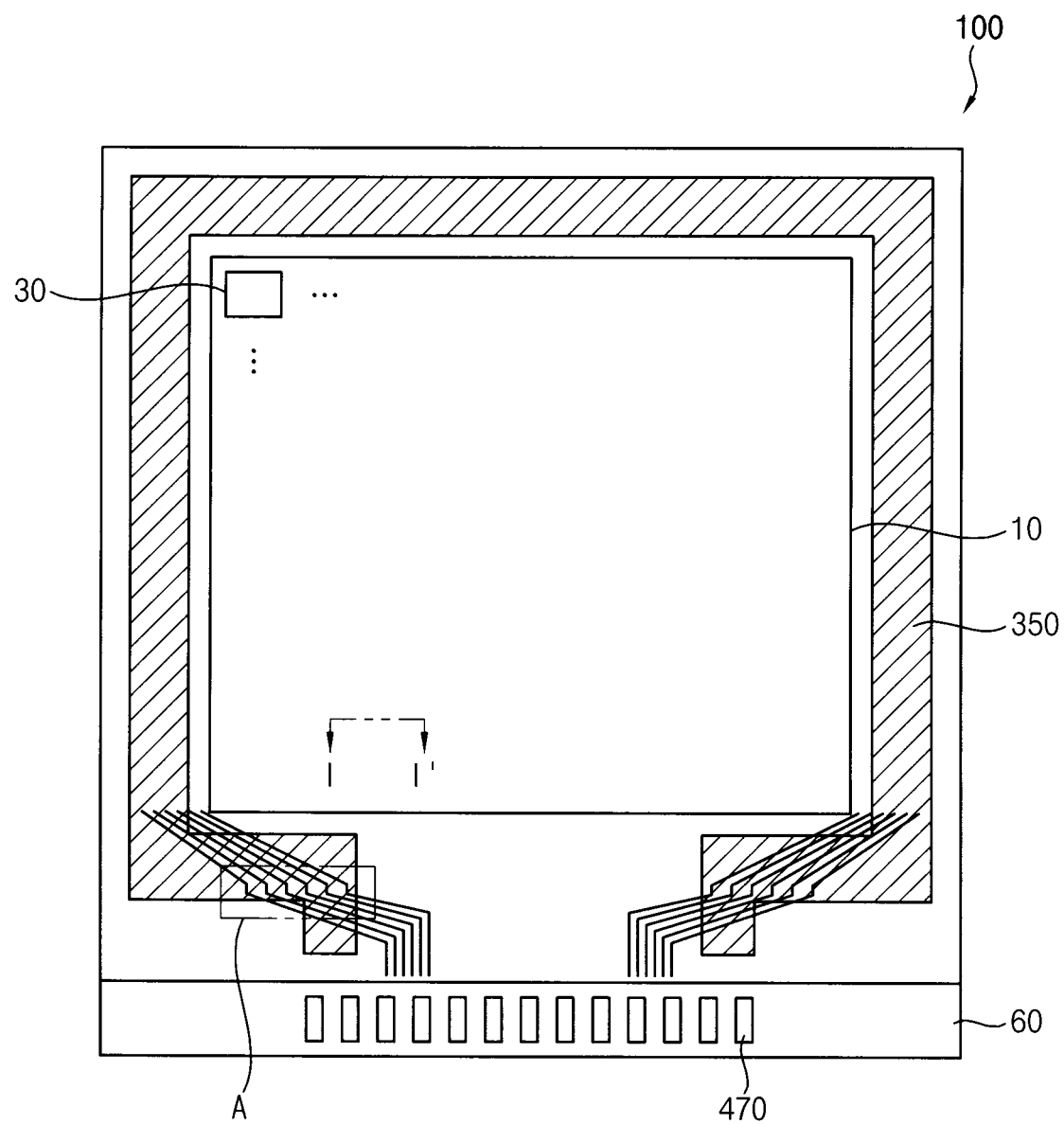
Figure 5:
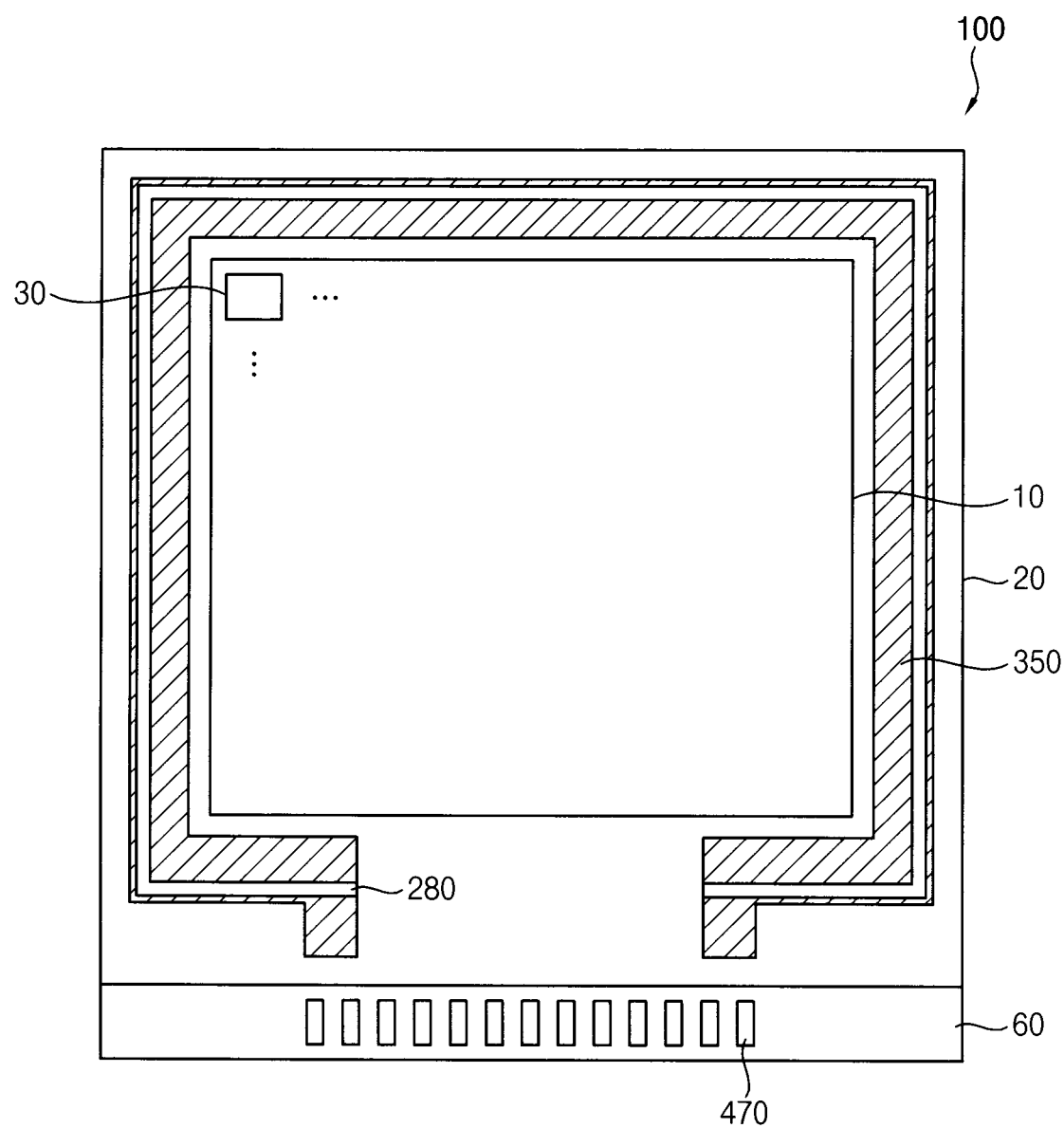
Figure 6:
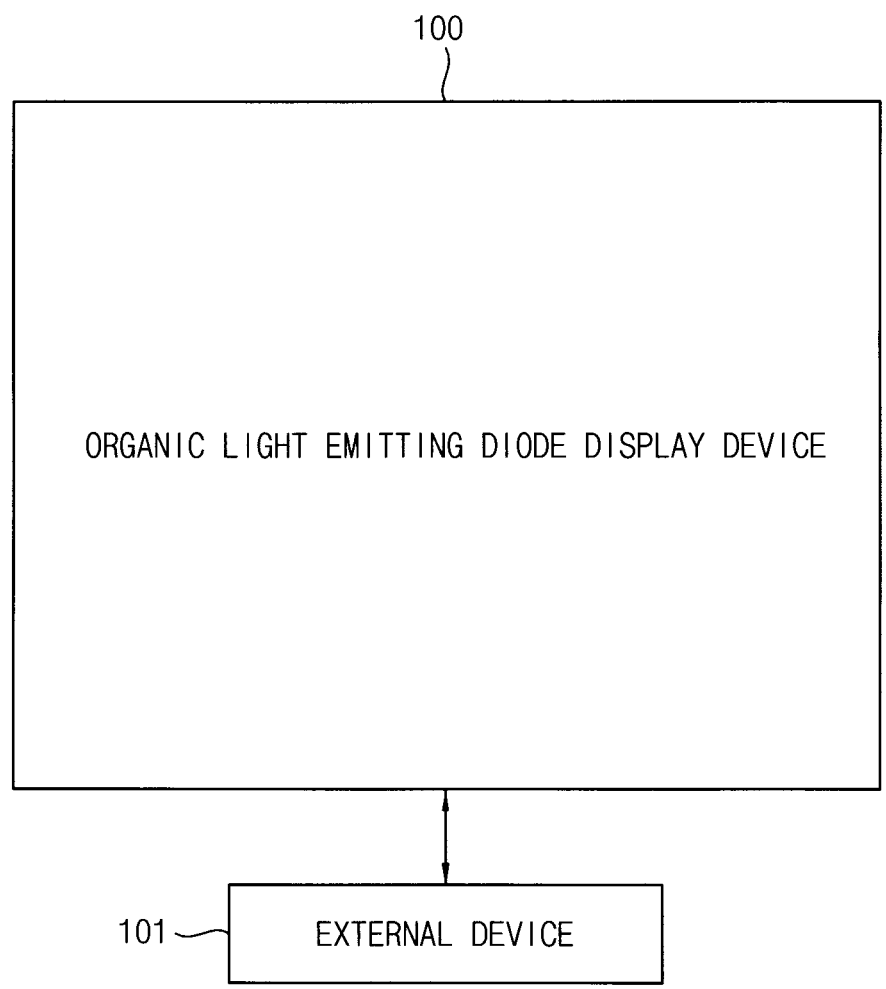
FIG. 6 is a block diagram for illustrating an external device electrically connected to the organic light emitting diode display device of FIG. 1.

In some exemplary embodiments, as shown in FIGS. 2, 4, and 5, the power supply wire 350 may be disposed in a portion of the peripheral region 20. In other words, the power supply wire 350 may be disposed in a portion of the first peripheral region 21 and the second peripheral region 22. The power supply wire 350 may have an annular or rectangular frame shape with an open bottom (e.g., a ring with an open bottom). In some exemplary embodiments, an opening 280 of a first planarization layer 270, which will be described below, may be located along an outer profile of the power supply wire 350. In other words, the opening 280 may at least partially surround (e.g., be around) the display region 10 in a plan view. The power supply wire 350 may be electrically connected to the pad electrodes 470 in the first peripheral region 21. For example, the power supply wire 350 may be electrically connected to ones of the pad electrodes 470 that are located at an outermost portion of the pad electrodes 470. A low power supply voltage may be applied to the power supply wire 350, and the low power supply voltage may be provided to a cathode electrode (e.g., upper electrode 340 of FIGS. 10, 11, and 12).

In addition, the power supply wire 350 may include: a first wire portion 351 next to the pad electrodes 470 in the first peripheral region 21, and a second wire portion 352 located in a portion of the first peripheral region 21 and the second peripheral region 22. In other words, the second wire portion 352 may include: first extension portions extending in a first direction D1 from the second peripheral region 22 adjacent to left and right sides of the display region 10; a second extension portion extending in a third direction D3 from the second peripheral region 22 adjacent to an upper side of the display region 10; and third extension portions extending in the third direction D3 from the second peripheral region 22 and a portion of the first peripheral region 21 adjacent to a lower side of the display region 10, and the first to third extension portions may be located along an outer profile of the display region 10. In this case, the second extension portion may be located between the first extension portions, the third extension portions may be substantially parallel to the second extension portion, and the first direction D1 and the third direction D3 may be substantially orthogonal to each other. For example, the second wire portion 352 may at least partially surround (or partially be around) the display region 10 in a plan view, and may have the annular or rectangular frame shape with the open bottom. The first wire portion 351 may have a shape protruding from a portion where the bottom of the second wire portion 352 is opened (e.g., a terminal portion of each of the third extension portions) in a direction from the display region 10 to the pad region 60 (e.g., in a second direction D2 opposite to the first direction D1). The first wire portion 351 and the second wire portion 352 may be integrally formed (e.g., formed as one unitary body). In some embodiments, the first wire portion 351 and the second wire portion 352 may be formed by connecting mutually different wires to each other. In some exemplary embodiments, the opening 280 may be formed along an outer profile of the second wire portion 352 without being disposed in the first wire portion 351.

In FIGS. 2, 4 and 5, the power supply wire 350 is shown as having a single wire for convenience, but the power supply wire 350 may be configured such that at least two wires overlap each other. In other words, the power supply wire 350 may have a structure in which at least two wires are stacked (e.g., the first sub-power supply wire 361 and the second sub-power supply wire 362 of FIGS. 10, 11, and 12).

Figure 3:
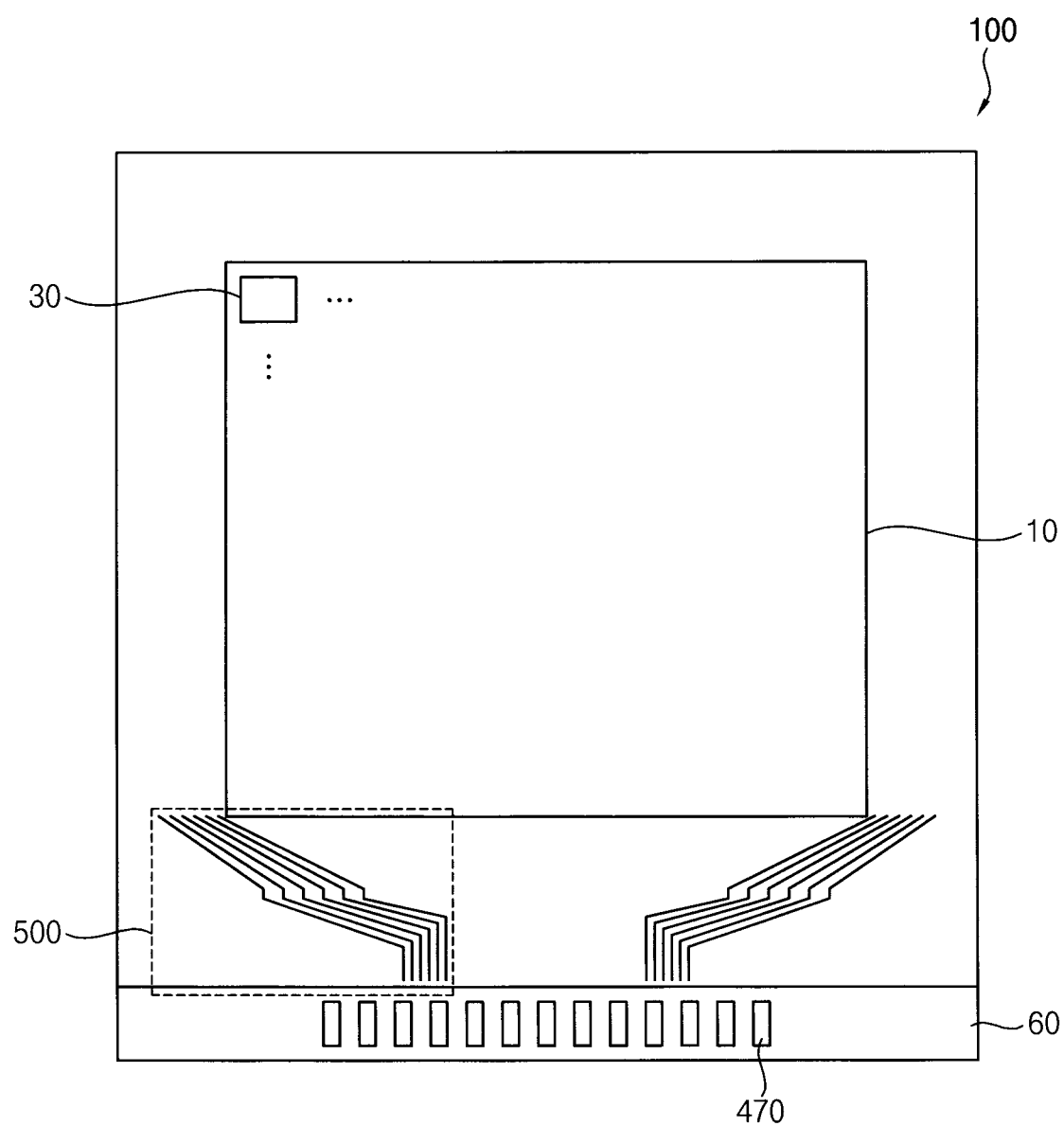

In addition, as shown in FIGS. 3 and 4, the fan-out wires 500 may be disposed in the first peripheral region 21 and a portion of the second peripheral region 22. The fan-out wires 500 may be disposed under the power supply wire 350. In some exemplary embodiments, each of the fan-out wires 500 may include a first diagonal portion, a straight portion, and a second diagonal portion, and the opening 280 may be formed in the peripheral region 20 adjacent to the pad region 60 to overlap a portion where the straight portion is disposed. For example, the first diagonal portion may be adjacent to the pad electrodes 470, the second diagonal portion may be adjacent to the display region 10, the straight portion may be located between the first and second diagonal portions, and the first diagonal portion, the straight portion, and the second diagonal portion may be integrally formed (e.g., formed as one unitary body).

A conventional organic light emitting diode display device may include fan-out wires including only a diagonal portion. For example, in the peripheral region adjacent to the pad region, the fan-out wires may have a diagonal shape, and an interval between the fan-out wires may be relatively reduced to reduce an area of the peripheral region adjacent to the pad region of the conventional organic light emitting diode display device. A first sub-power supply wire may be disposed on the fan-out wires having the reduced interval, and a first planarization layer may be disposed on the first sub-power supply wire. The first planarization layer may have a plurality of openings exposing the first sub-power supply wire, and a second sub-power supply wire may be disposed on the first planarization layer. The second sub-power supply wire may make contact with the first sub-power supply wire through the opening. However, cracks may be generated in the second sub-power supply wire arranged along a profile of the fan-out wires because of a V-shaped stepped portion of the fan-out wires having the reduced interval in the openings, and the conventional organic light emitting diode display device may be defective.

In some exemplary embodiments, each of the fan-out wires 500 includes a straight portion, so that an interval between the fan-out wires 500 may be relatively increased in a portion where the straight portion is formed. In this case, because a V-shaped stepped portion is not generated, the second sub-power supply wire may be relatively less affected by the profile of the fan-out wires 500, and cracks may not be generated in the second sub-power supply wire formed in the opening 280.

In FIGS. 3 and 4, although the fan-out wires 500 are shown as including twelve fan-out wires for convenience, the fan-out wires 500 may be additionally provided in the peripheral region 20 adjacent to the pad region 60. However, for convenience of explanation, the fan-out wires 500 will be described as including six fan-out wires located on a left side of the peripheral region 20 adjacent to the pad region 60. The fan-out wires 500 may be provided with a gate signal, a data signal, a light emission control signal, a gate initialization signal, an initialization voltage, and/or the like.

For example, fan-out wires that do not overlap the opening 280 (e.g., an outermost fan-out wire disposed at an outermost portion of the peripheral region 20) from among the additionally provided fan-out wires may be further provided in the peripheral region 20. Because lengths of the fan-out wires 500 have been relatively increased, the outermost fan-out wire may further include a straight portion, and the relatively increased lengths of the fan-out wires 500 may be the same as an increased length of the outermost fan-out wire.

In other exemplary embodiments, a high power supply wire may be disposed in a portion of the peripheral region 20. In other words, the high power supply wire may be disposed in a portion of the first peripheral region 21, and may be disposed between power supply wires 350 in the first peripheral region 21. In some embodiments, the high power supply wire may extend from the first peripheral region 21 to the display region 10, and may have a lattice shape in the display region 10. The high power supply wire may be electrically connected to the pad electrodes 470 in the first peripheral region 21. For example, the high power supply wire may be electrically connected to ones of the pad electrodes 470 located on an inner side the pad electrodes 470, which are connected to the power supply wire 350. A high power supply voltage may be applied to the high power supply wire, and the high power supply voltage may be provided to an anode electrode (e.g., lower electrode 290 of FIGS. 10, 11, and 12).

Referring again to FIGS. 1 to 6, the pad electrodes 470 electrically connected to an external device 101 may be disposed in the pad region 60. In addition, connection electrodes may be disposed between the pad electrodes 470 and the power supply wire 350. For example, the connection electrodes may electrically connect the pad electrodes 470 to the power supply wire 350.

The external device 101 may be electrically connected to the organic light emitting diode display device 100 through a flexible printed circuit board or a printed circuit board. For example, one side of the flexible printed circuit board may make direct contact with the pad electrodes 470, and an opposite side of the flexible printed circuit board may make direct contact with the external device 101. The external device 101 may provide a data signal, a gate signal, a light emission control signal, a gate initialization signal, an initialization voltage, a power supply voltage, and the like to the organic light emitting diode display device 100. In some exemplary embodiments, a low power supply voltage (e.g., the low power supply voltage ELVSS of FIG. 9) may be generated from the external device 101, and the low power supply voltage may be provided to the power supply wire 350 through the flexible printed circuit board, the pad electrodes 470, and the connection electrodes. In addition, a high power supply voltage (e.g., the high power supply voltage ELVDD of FIG. 9) may be generated by the external device 101, and the high power supply voltage may be provided to the high power supply wire through the flexible printed circuit board, the pad electrodes 470, and the connection electrodes. Furthermore, a driver integrated circuit may be mounted on the flexible printed circuit board. In other exemplary embodiments, the driver integrated circuit may be mounted on the organic light emitting diode display device 100 near the pad electrodes 470.

Figure 7:
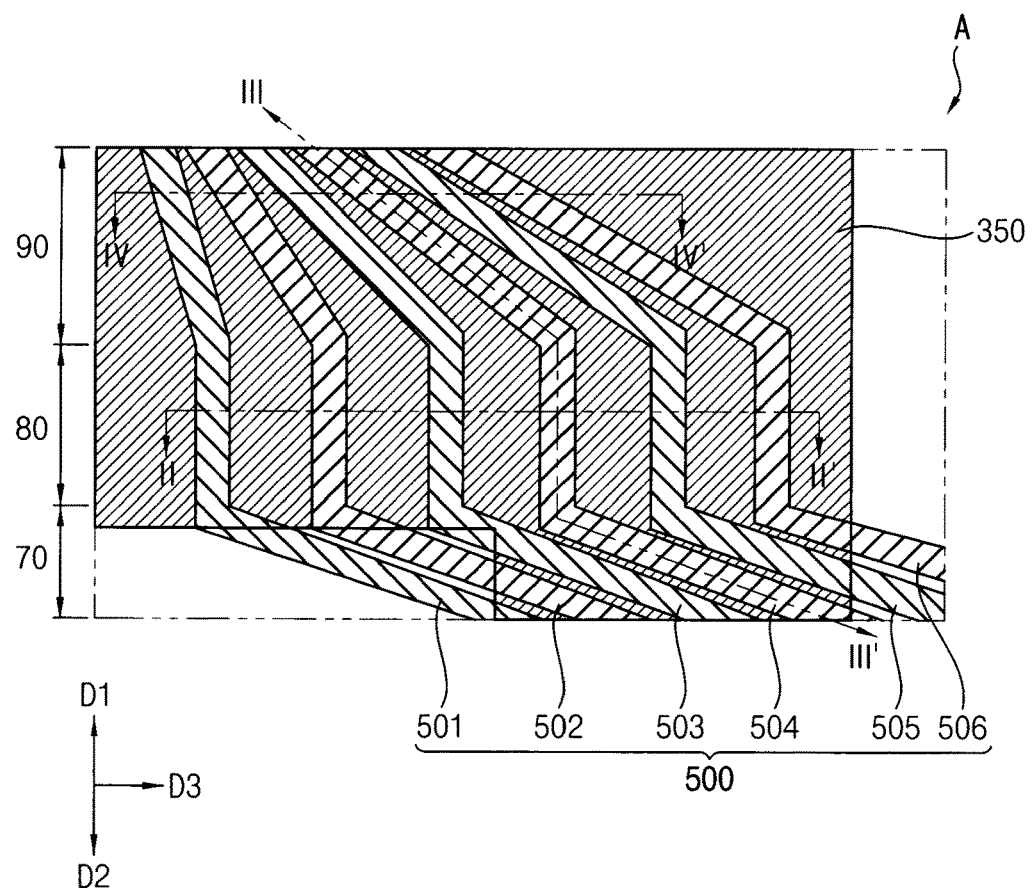
FIG. 7 is a partially enlarged plan view showing the region 'A' of FIG. 4.
Figure 8:
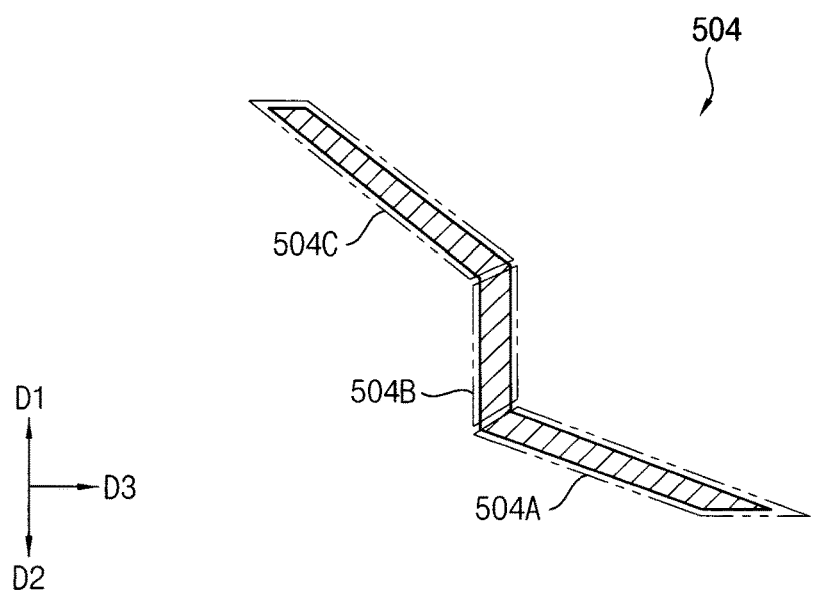
FIG. 8 is a plan view for illustrating the fan-out wires shown in FIG. 7.

FIG. 7 is a partially enlarged plan view showing the region 'A' of FIG. 4, and FIG. 8 is a plan view for illustrating the fan-out wires shown in FIG. 7.

Referring to FIGS. 7 and 8, the fan-out wires 500 may include first to sixth fan-out wires 501, 502, 503, 504, 505, and 506. Each of the fan-out wires 500 may include a first diagonal portion, a straight portion, and a second diagonal portion. The straight portion may extend in a first direction D1, and the first and second diagonal portions may extend in a direction different from the extension direction of the straight portion. The first and second diagonal portions and the straight portion may be integrally formed (e.g., formed as one unitary body). For example, the peripheral region 20 adjacent to the pad region 60 may be divided into a first diagonal region 70, a straight region 80, and a second diagonal region 90, in which the first diagonal portion of each of the fan-out wires 500 may be located in the first diagonal region 70, the straight portion of each of the fan-out wires 500 may be located in the straight region 80, and the second diagonal portion of each of the fan-out wires 500 may be located in the second diagonal region 90. In this case, the opening 280 may overlap the straight region 80. In other words, at least two fan-out wires may be disposed under a portion overlapping the opening 280.

Referring to the fourth fan-out wire 504 shown in FIG. 8, the fourth fan-out wire 504 may include a first diagonal portion 504A, a straight portion 504B, and a second diagonal portion 504C. A first end of the first diagonal portion 504A may be adjacent to the pad region 60 and may extend in a first diagonal direction, and the straight portion 504B may extend from a second end of the first diagonal portion 504A in the first direction D1. In this case, a first end of the straight portion 504B may be connected to the second end of the first diagonal portion 504A. In addition, the second diagonal portion 504C may extend from a second end of the straight portion 504B in a second diagonal direction, and a second end of the second diagonal portion 504C may be connected to a wire located in the second peripheral region 22 or a wire disposed in the display region 10. In this case, the first diagonal direction and the second diagonal direction may be the same or may be different from each other. In some exemplary embodiments, a length of the straight portion 504B may be shorter than a length of each of the first and second diagonal portions 504A and 504C.

In this manner, each of the first, second, third, fifth, and sixth fan-out wires 501, 502, 503, 505, and 506 may have a straight portion, a first diagonal portion, and a second diagonal portion.

In some exemplary embodiments, the fan-out wires 500 may be divided into lower fan-out wires and upper fan-out wires. For example, the lower fan-out wires may include first, third, and fifth fan-out wires 501, 503, and 505, and the upper fan-out wires may include second, fourth, and sixth fan-out wires 502, 504, and 506. The upper fan-out wires may be disposed on the lower fan-out wires, and the lower fan-out wires and the upper fan-out wires may be alternately disposed without overlapping each other.

Although the fan-out wires 500 have been described as including six fan-out wires, the configuration of the present invention is not limited thereto, and the fan-out wires 500 may include any suitable number of fan-out wires. For example, the fan-out wires 500 may include at least seven fan-out wires.

In other words, the fan-out wires may include first to $N^{th}$ fan-out wires (where N is an integer greater than or equal to 2), and $K^{th}$ and (K+1)th fan-out wires (where K is an integer between 1 and N) from among the first to $N^{th}$ fan-out wires may be located on mutually different layers without overlapping each other.

The power supply wire 350 may be disposed in the first peripheral region 21 and a portion of the second peripheral region 22 (or the peripheral region 20 adjacent to the pad region 60) on the fan-out wires 500. The power supply wire 350 may be disposed along the profile of the fan-out wires 500 on the fan-out wires 500. In some exemplary embodiments, the power supply wire 350 may include a first sub-power supply wire 361 and a second sub-power supply wire 362. In the straight region 80, the first sub-power supply wire 361 and the second sub-power supply wire 362 may make direct contact with each other through the opening 280 of the first planarization layer 270 (e.g., see FIG. 11).

Figure 9:
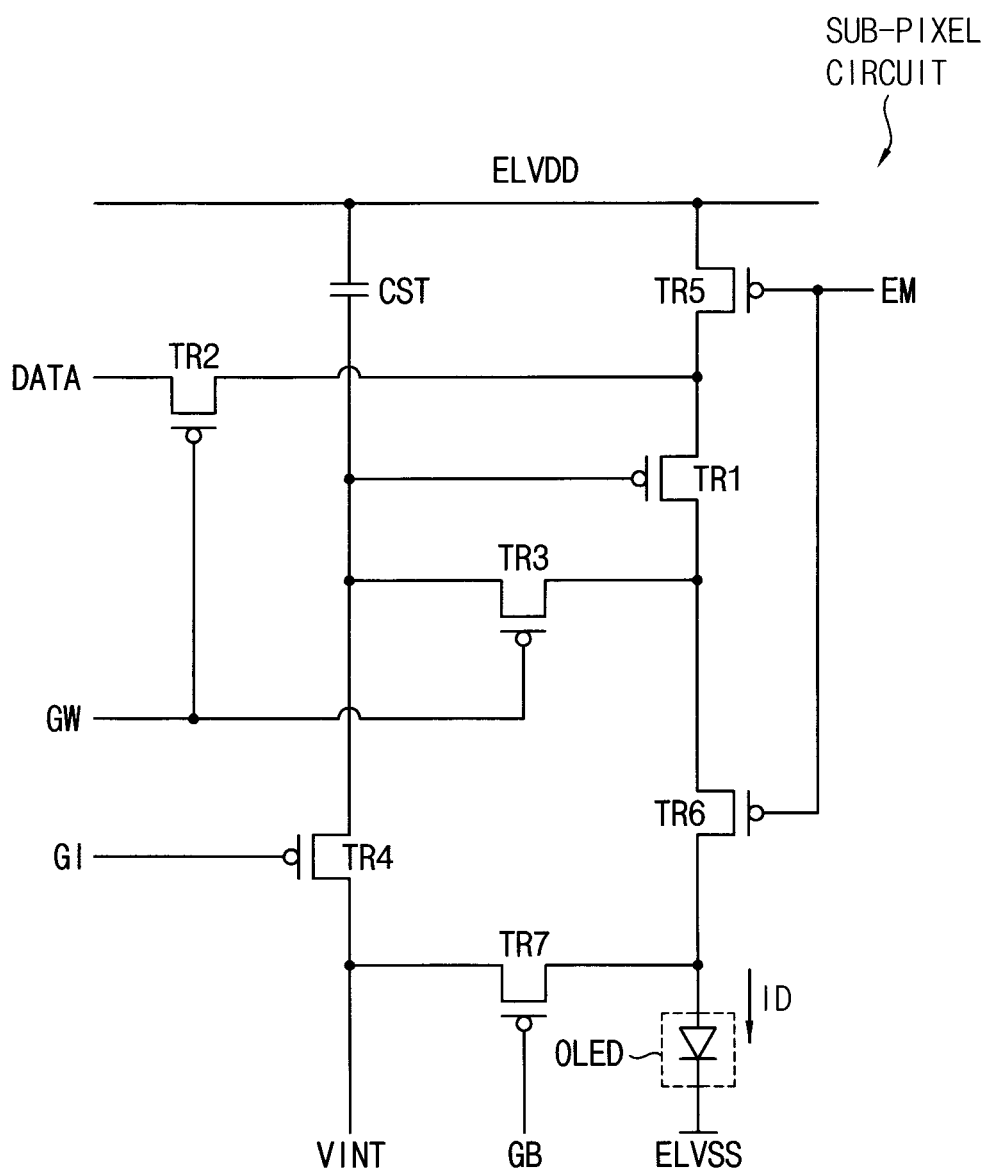
FIG. 9 is a circuit diagram showing a sub-pixel circuit disposed in a sub-pixel circuit region of FIG. 1 and an organic light emitting diode disposed on the sub-pixel circuit.

FIG. 9 is a circuit diagram showing a sub-pixel circuit disposed in a sub-pixel circuit region of FIG. 1 and an organic light emitting diode disposed on the sub-pixel circuit.

Referring to FIG. 9, the sub-pixel circuit SPC and the organic light emitting diode OLED may be disposed in each of the sub-pixel circuit regions 30 of the organic light emitting diode display device 100. One sub-pixel circuit SPC may include an organic light emitting diode OLED (e.g., the sub-pixel structure 200 of FIGS. 10, 11, and 12), first to seventh transistors TR1, TR2, TR3, TR4, TR5, TR6, and TR7 (e.g., the semiconductor element 250 of FIGS. 10, 11, and 12), a storage capacitor CST, a high power supply voltage (ELVDD) wire, a low power supply voltage (ELVSS) wire (e.g., the power supply wire 350 of FIGS. 10, 11, and 12), an initialization voltage (VINT) wire, a data signal (DATA) wire, a gate signal (GW) wire, a gate initialization signal (GI) wire, a light emission control signal (EM) wire, and a diode initialization signal (GB) wire. The first transistor TR1 may correspond to a driving transistor, and the second to seventh transistors TR2, TR3, TR4, TR5, TR6, and TR7 may correspond to switching transistors. Each of the first to seventh transistors TR1, TR2, TR3, TR4, TR5, TR6, and TR7 may include a first terminal, a second terminal, a channel, and a gate terminal. In some exemplary embodiments, the first terminal may be a source terminal, and the second terminal may be a drain terminal. In some embodiments, the first terminal may be a drain terminal, and the second terminal may be a source terminal.

The organic light emitting diode OLED may output a light based on a driving current ID. The organic light emitting diode OLED may include a first terminal and a second terminal. In some exemplary embodiments, the second terminal of the organic light emitting diode OLED may receive a low power supply voltage ELVSS, and the first terminal of the organic light emitting diode OLED may receive a high power supply voltage ELVDD. For example, the first terminal of the organic light emitting diode OLED may be an anode terminal, and the second terminal of the organic light emitting diode OLED may be a cathode terminal. In some embodiments, the first terminal of the organic light emitting diode OLED may be a cathode terminal, and the second terminal of the organic light emitting diode OLED may be an anode terminal. In some exemplary embodiments, the anode terminal of the organic light emitting diode OLED may correspond to a lower electrode 290 of FIGS. 10, 11, and 12, and the cathode terminal of the organic light emitting diode OLED may correspond to an upper electrode 340 of FIGS. 10, 11, and 12.

The first transistor TR1 may generate the driving current ID. In some exemplary embodiments, the first transistor TR1 may operate in a saturation region. In this case, the first transistor TR1 may generate the driving current ID based on a voltage difference between the gate terminal and the source terminal. In addition, a gray scale level may be expressed based on a magnitude of the driving current ID supplied to the organic light emitting diode OLED. In some embodiments, the first transistor TR1 may operate in a linear region. In this case, the gray scale level may be expressed based on the sum of times during which the driving current is supplied to the organic light emitting diode OLED within one frame.

The gate terminal of the second transistor TR2 may receive a gate signal GW. The first terminal of the second transistor TR2 may receive a data signal DATA. The second terminal of the second transistor TR2 may be connected to the first terminal of the first transistor TR1. For example, the gate signal GW may be provided from the gate driver, and the gate signal GW may be applied to the gate terminal of the second transistor TR2 through the gate signal (GW) wire. The second transistor TR2 may supply the data signal DATA to the first terminal of the first transistor TR1 during an activation period of the gate signal GW. In this case, the second transistor TR2 may operate in the linear region.

The gate terminal of the third transistor TR3 may receive the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver, and the gate signal GW may be applied to the gate terminal of the third transistor TR3 through the gate signal (GVV) wire. The third transistor TR3 may connect the gate terminal of the first transistor TR1 to the second terminal of the first transistor TR1 during the activation period of the gate signal GW. In this case, the third transistor TR3 may operate in the linear region. In other words, the third transistor TR3 may diode-connect the first transistor TR1 during the activation period of the gate signal GW. Because the first transistor TR1 is diode-connected, a voltage difference equal to a threshold voltage of the first transistor TR1 may be generated between the first terminal of the first transistor TR1 and the gate terminal of the first transistor TR1. As a result, a voltage obtained by adding the voltage difference (i.e., the threshold voltage) to a voltage of the data signal DATA supplied to the first terminal of the first transistor TR1 during the activation period of the gate signal GW may be supplied to the gate terminal of the first transistor TR1. In other words, the data signal DATA may be compensated by an amount of the threshold voltage of the first transistor TR1, and the compensated data signal DATA may be supplied to the gate terminal of the first transistor TR1. As the threshold voltage compensation is performed, a problem of non-uniformity of the driving current, which is caused by variation of the threshold voltage of the first transistor TR1 (e.g., a deviation between threshold voltages of different first transistors), may be solved.

An input terminal of the initialization voltage wire provided with an initialization voltage VINT may be connected to the first terminal of the fourth transistor TR4 and the first terminal of the seventh transistor TR7, and an output terminal of the initialization voltage wire may be connected to the second terminal of the fourth transistor TR4 and a first terminal of the storage capacitor CST. In other words, the initialization voltage VINT may be provided to the second terminal of the fourth transistor TR4 and a first terminal of the storage capacitor CST via the fourth transistor TR4.

The gate terminal of the fourth transistor TR4 may receive a gate initialization signal GI. The first terminal of the fourth transistor TR4 may receive the initialization voltage VINT. The second terminal of the fourth transistor TR4 may be connected to the gate terminal of the first transistor TR1.

The fourth transistor TR4 can supply the initialization voltage VINT to the gate terminal of the first transistor TR1 during the activation period of the gate initialization signal GI. In this case, the fourth transistor TR4 may operate in the linear region. In other words, the fourth transistor TR4 may initialize the gate terminal of the first transistor TR1 to the initialization voltage VINT during an activation period of the gate initialization signal GI. In some exemplary embodiments, a voltage level of the initialization voltage VINT may be sufficiently lower than a voltage level of the data signal DATA maintained by the storage capacitor CST in a previous frame, and the initialization voltage VINT may be supplied to the gate terminal of the first transistor TR1. In other exemplary embodiments, the voltage level of the initialization voltage may be sufficiently higher than the voltage level of the data signal maintained by the storage capacitor in the previous frame, and the initialization voltage may be supplied to the gate terminal of the first transistor.

In some exemplary embodiments, the gate initialization signal GI may be a signal that is substantially the same as the gate signal GW before one horizontal time. For example, among the sub-pixel circuits included in the organic light emitting diode display device 100, the gate initialization signal GI supplied to the sub-pixel circuits in an $n^{th}$ row (where n is an integer greater than or equal to 2) may be substantially the same signal as the gate signal GW supplied to the sub-pixel circuits in an $(n-1)^{th}$ row. In other words, an activated gate signal GW is supplied to the first sub-pixel circuit from among the sub-pixel circuits SPC in the $(n-1)^{th}$ row, so that an activated gate initialization signal GI may be supplied to the first sub-pixel circuit from among the sub-pixel circuits SPC in the $n^{th}$ row. As a result, while supplying the data signal DATA to the sub-pixel circuit in the $(n-1)^{th}$ row from among the sub-pixel circuits, the gate terminal of the first transistor TR1 included in the sub-pixel circuit in the $n^{th}$ row from among the sub-pixel circuits SPC may be initialized to the initialization voltage VINT.

The gate terminal of the fifth transistor TR5 may receive a light emission control signal EM. The first terminal of the fifth transistor TR5 may be connected to the high power supply voltage (ELVDD) wire. The second terminal of the fifth transistor TR5 may be connected to the first terminal of the first transistor TR1. For example, the light emission control signal EM may be provided from a light emission control driver, and the light emission control signal EM may be applied to the gate terminal of the fifth transistor TR5 through the light emission control signal (EM) wire. The fifth transistor TR5 may supply the high power supply voltage ELVDD to the first terminal of the first transistor TR1 during an activation period of the light emission control signal EM. On the contrary, the fifth transistor TR5 may cut off the supply of the high power supply voltage ELVDD during a deactivation period of the light emission control signal EM. In this case, the fifth transistor TR5 may operate in the linear region. The fifth transistor TR5 supplies the high power supply voltage ELVDD to the first terminal of the first transistor TR1 during the activation period of the light emission control signal EM, so that the first transistor TR1 may generate the driving current ID. In addition, the fifth transistor TR5 cuts off the supply of the high power supply voltage ELVDD during the deactivation period of the light emission control signal EM, so that the data signal DATA supplied to the first terminal of the first transistor TR1 may be supplied to the gate terminal of the first transistor TR1.

The gate terminal of the sixth transistor TR6 (e.g., the semiconductor element 250 of FIGS. 10, 11, and 12) may receive the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in the linear region. In other words, the sixth transistor TR6 supplies the driving current ID generated by the first transistor TR1 to the organic light emitting diode OLED during the activation period of the light emission control signal EM, so that the organic light emitting diode OLED may output a light. In addition, the sixth transistor TR6 electrically separates the first transistor TR1 and the organic light emitting diode OLED from each other during a deactivation period of the light emission control signal EM, so that the data signal DATA (i.e., the data signal that has been subject to the threshold voltage compensation) supplied to the second terminal of the first transistor TR1 may be supplied to the gate terminal of the first transistor TR1.

The gate terminal of the seventh transistor TR7 may receive a diode initialization signal GB. The first terminal of the seventh transistor TR7 may receive the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in the linear region. In other words, the seventh transistor TR7 may initialize the first terminal of the organic light emitting diode OLED to the initialization voltage VINT during the activation period of the diode initialization signal GB.

In some embodiments, the gate initialization signal GI and the diode initialization signal GB may be substantially the same signal. An operation of initializing the gate terminal of the first transistor TR1 and an operation of initializing the first terminal of the organic light emitting diode OLED may not influence each other. In other words, the operation of initializing the gate terminal of the first transistor TR1 and the operation of initializing the first terminal of the organic light emitting diode OLED may be independent of each other. Accordingly, the diode initialization signal GB is not separately generated, so that economic efficiency of a process can be improved (e.g., increased).

The storage capacitor CST may include a first terminal and a second terminal. The storage capacitor CST may be connected between the high power supply voltage (ELVDD) wire and the gate terminal of the first transistor TR1. For example, the first terminal of the storage capacitor CST may be connected to the gate terminal of the first transistor TR1, and the second terminal of the storage capacitor CST may be connected to the high power supply voltage (ELVDD) wire. The storage capacitor CST may maintain a voltage level of the gate terminal of the first transistor TR1 during the deactivation period of the gate signal GW. The deactivation period of the gate signal GW may include the activation period of the light emission control signal EM, and the driving current ID generated by the first transistor TR1 may be supplied to the organic light emitting diode OLED during the activation period of the light emission control signal EM. Therefore, the driving current ID generated by the first transistor TR1 may be supplied to the organic light emitting diode OLED based on the voltage level maintained by the storage capacitor CST.

Although the sub-pixel circuit SPC of the present invention has been described as including seven transistors and one storage capacitor, the configuration of the present invention is not limited thereto. For example, the sub-pixel circuit SPC may have a configuration including at least one transistor and at least one storage capacitor.

Figure 10:
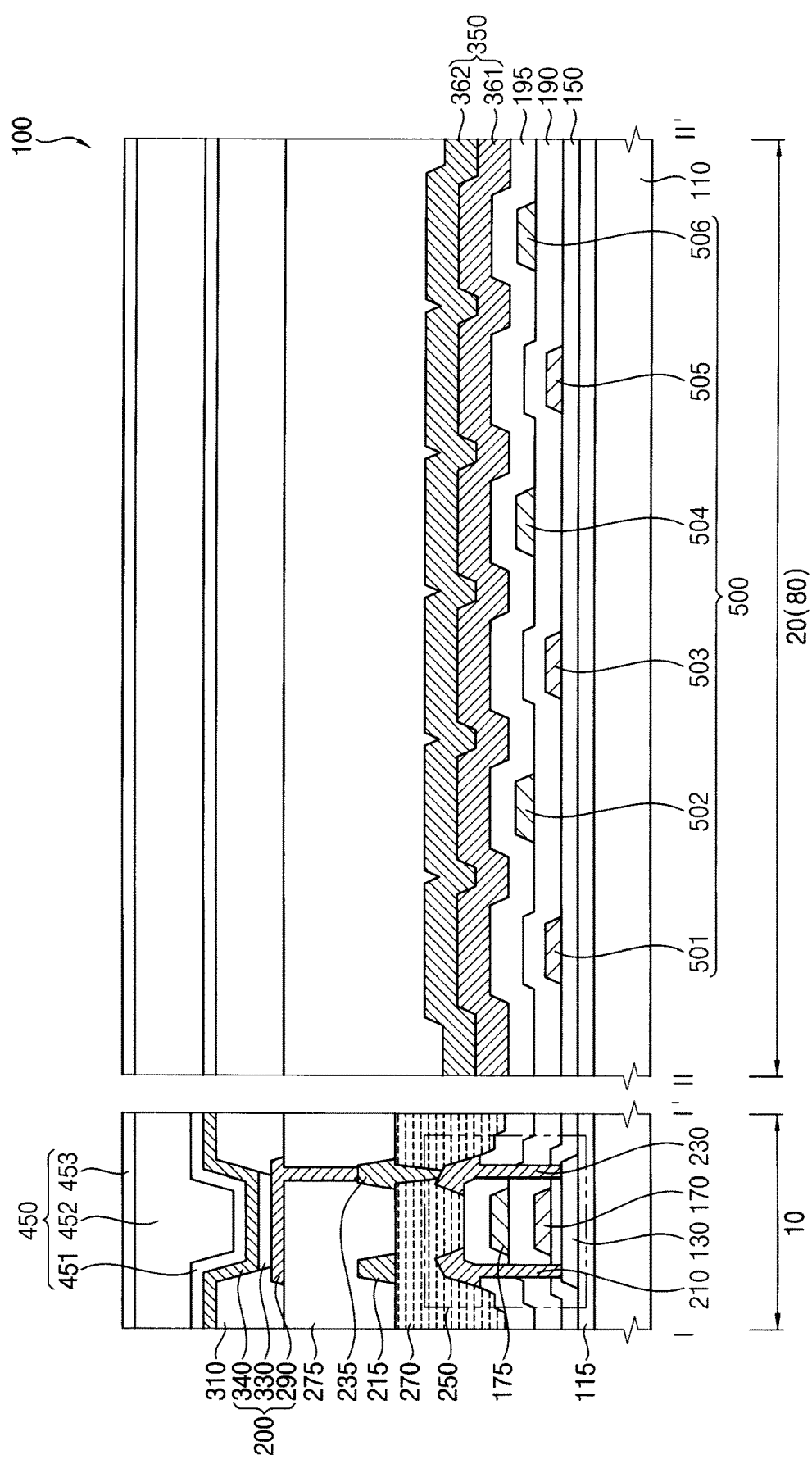
FIG. 10 is a cross-sectional view taken along the line I-I' of FIG. 4 and the line II-II' of FIG. 7.
Figure 11:
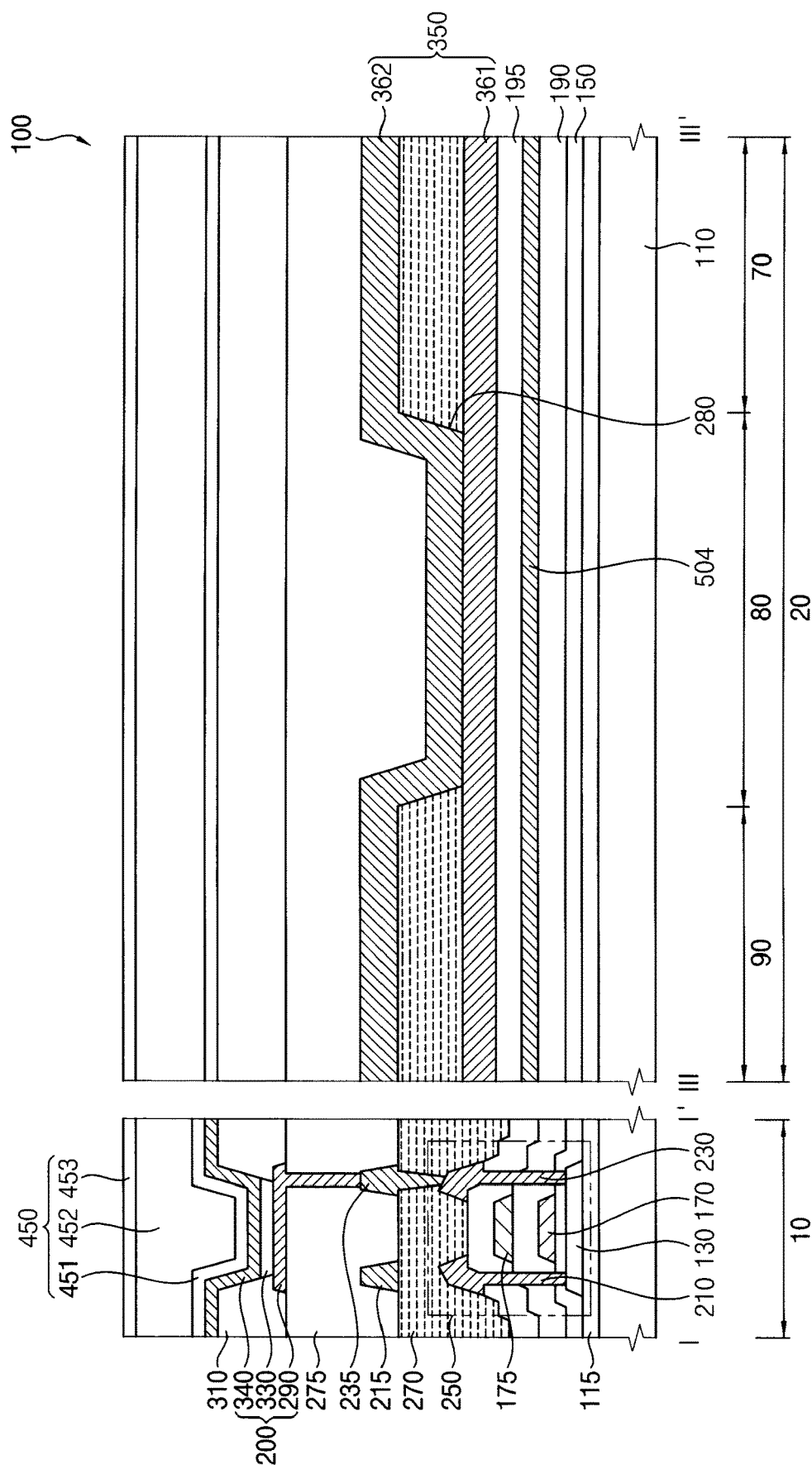
FIG. 11 is a cross-sectional view taken along the line I-I' of FIG. 4 and the line III-III' of FIG. 7.

FIG. 10 is a cross-sectional view taken along the line I-I' of FIG. 4 and the line II-II' of FIG. 7; FIG. 11 is a cross-sectional view taken along the line I-I' of FIG. 4 and the line III-III' of FIG. 7; and FIG. 12 is a cross-sectional view taken along the line I-I' of FIG. 4 and the line IV-IV' of FIG. 7.

Figure 12:
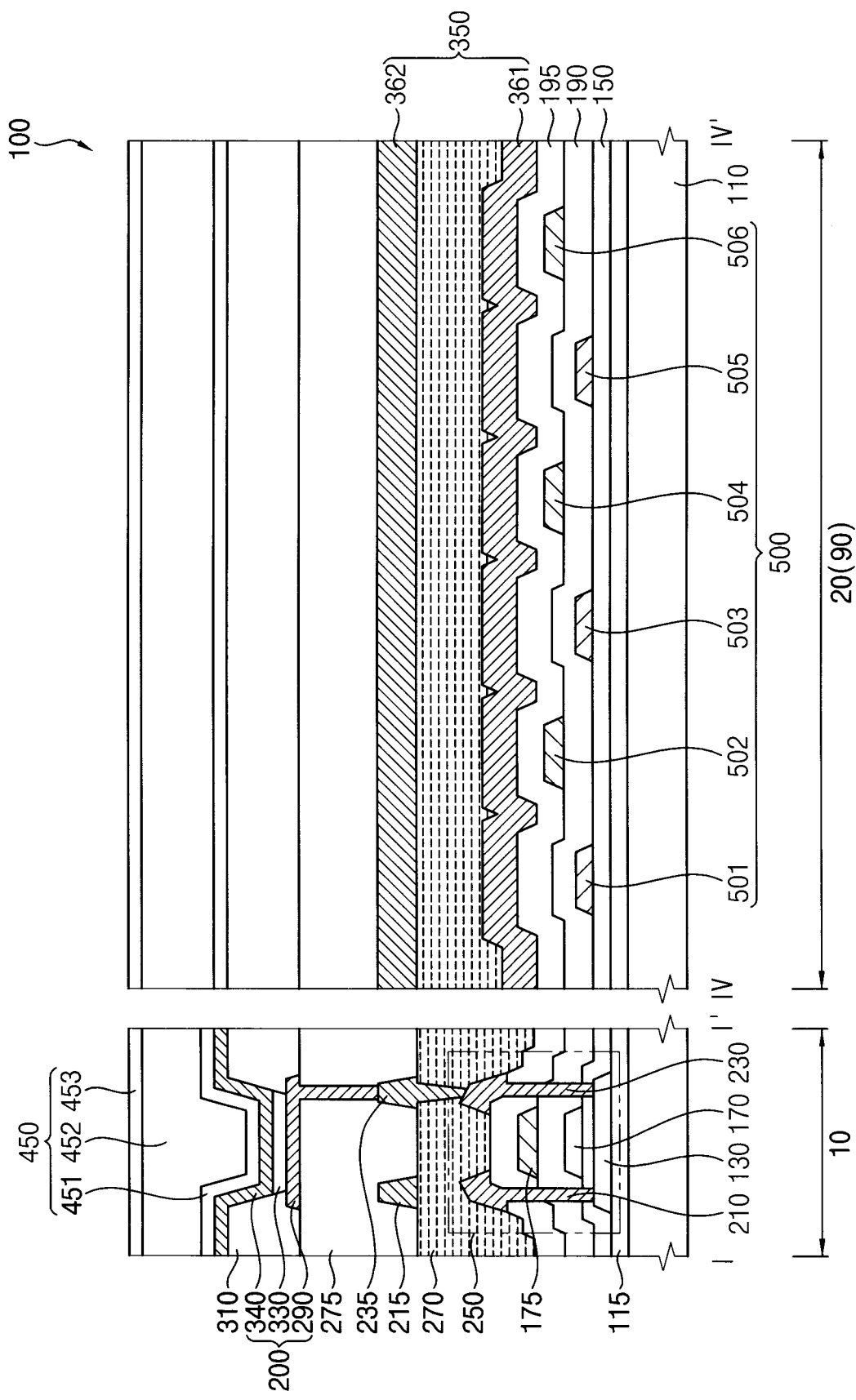
FIG. 12 is a cross-sectional view taken along the line I-I' of FIG. 4 and the line IV-IV' of FIG. 7.

Referring to FIGS. 10, 11, and 12, the organic light emitting diode display device 100 may include a substrate 110, a buffer layer 115, a semiconductor element 250, a sub-pixel structure 200, fan-out wires 500, a first planarization layer 270, a power supply wire 350, a second planarization layer 275, a wiring pattern 215, a connection pattern 235, a pixel defining layer 310, a thin film encapsulation structure 450. The semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230. The fan-out wires 500 may include first to sixth fan-out wires 501, 502, 503, 504, 505, and 506. In this case, the first, third, and fifth fan-out wires 501, 503, and 505 may be defined as lower fan-out wires, and the second, fourth, and sixth fan-out wires 502, 504, and 506 may be defined as upper fan-out wires. In addition, the power supply wire 350 may include a first sub-power supply wire 361 and a second sub-power supply wire 362, and the sub-pixel structure 200 may include a lower electrode 290, a light emitting layer 330, and an upper electrode 340. Furthermore, the thin film encapsulation structure 450 may include a first thin film encapsulation layer 451, a second thin film encapsulation layer 452, and a third thin film encapsulation layer 453.

A substrate 110 including transparent or opaque materials may be provided. The substrate 110 may be formed of a transparent resin substrate having flexibility. In some exemplary embodiments, the substrate 110 may have a configuration in which a first organic layer, a first barrier layer, a second organic layer, and a second barrier layer are sequentially stacked. The first barrier layer and the second barrier layer may include an inorganic material such as silicon oxide, and may prevent or substantially prevent water and/or moisture from penetrating through the first and second organic layers. In addition, the first organic layer and the second organic layer may include an organic material such as a polyimide-based resin, and may have flexibility.

Because the substrate 110 is thin and flexible, the substrate 110 may be formed on a rigid glass substrate to support the formation of the semiconductor element 250 and the sub-pixel structure 200. For example, after the buffer layer 115 is disposed on the second barrier layer, the semiconductor element 250 and the sub-pixel structure 200 may be formed on the buffer layer 115. After the formation of the semiconductor element 250 and the sub-pixel structure 200, the glass substrate may be removed. In other words, due to flexible physical properties of the substrate 110, it may be difficult to directly form the semiconductor element 250 and the sub-pixel structure 200 on the substrate 110. Regarding the above facts, the semiconductor element 250 and the sub-pixel structure 200 are formed by using the rigid glass substrate, and the glass substrate is removed, so that the first organic layer, the first barrier layer, the second organic layer, and the second barrier layer may be used as the substrate 110.

As the organic light emitting diode display device 100 includes the display region 10; the peripheral region 20 that includes the first peripheral region 21 and the second peripheral region 22; and the pad region 60, as shown in FIGS. 10-12, the substrate 110 may similarly be divided into the display region 10 and the peripheral region 20 (e.g., see FIG. 1).

In some embodiments, the substrate 110 may be formed of a quartz substrate, a synthetic quartz substrate, a calcium fluoride substrate, a fluorine-doped quartz substrate (F-doped quartz substrate), a soda lime glass substrate, a non-alkali glass substrate, and/or the like.

Although the substrate 110 has been described as having four layers, the configuration of the present invention is not limited thereto. For example, in other exemplary embodiments, the substrate 110 may include a single layer or a plurality of layers.

The buffer layer 115 may be disposed on the substrate 110. The buffer layer 115 may be disposed over the display region 10 and the peripheral region 20 and on the substrate 110. The buffer layer 115 may prevent or substantially prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer 115 may serve to improve (e.g., increase) the flatness of the surface of the substrate 110. Depending on a type of substrate 110, at least two buffer layers 115 may be provided on the substrate 110, or the buffer layer 115 may not be provided. The buffer layer 115 may include a silicon compound, metal oxide, and/or the like. For example, the buffer layer 115 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and/or the like.

The active layer 130 may be disposed on the buffer layer 115 in the display region 10. The active layer 130 may include an oxide semiconductor, an inorganic semiconductor (e.g., an amorphous silicon or poly silicon semiconductor), an organic semiconductor, and/or the like. The active layer 130 may have a source region, a drain region, and a channel region located between the source region and the drain region.

The gate insulating layer 150 may be disposed on the active layer 130. The gate insulating layer 150 may extend from the display region 10 to the peripheral region 20 and cover the active layer 130, which is on the buffer layer 115 in the display region 10. For example, the gate insulating layer 150 may be disposed along a profile of the active layer 130 with a uniform (or substantially uniform) thickness to cover the active layer 130, which is on the buffer layer 115. In some embodiments, the gate insulating layer 150 may cover the active layer 130 on the buffer layer 115, and may have a substantially flat top surface without creating a step (or bump) around the active layer 130. The gate insulating layer 150 may include a silicon compound, metal oxide, and/or the like. In other exemplary embodiments, the gate insulating layer 150 may have a multilayer structure having a plurality of insulating layers including materials that are different from each other.

The first gate electrode 170 may be disposed on the gate insulating layer 150 in the display region 10. The first gate electrode 170 may be disposed on a portion of the gate insulating layer 150 under which the active layer 130 is located (e.g., to overlap the channel region of the active layer 130). The first gate electrode 170 may include a metal, an alloy, metal nitride, conductive metal oxide, a transparent conductive material, and the like. These may be used alone or in combination with each other. In other exemplary embodiments, the first gate electrode 170 may have a multilayer structure including a plurality of layers.

The first, third, and fifth fan-out wires 501, 503, and 505 (e.g., the lower fan-out wires) may be disposed on the gate insulating layer 150 in the peripheral region 20. The lower fan-out wires may be spaced apart from each other. For example, a section of each of the first, third, and fifth fan-out wires 501, 503, and 505 shown in FIG. 10 may correspond to the straight portion of each of the first, third, and fifth fan-out wires 501, 503, and 505 located in the straight region 80 of FIG. 7. In addition, a section of each of the first, third, and fifth fan-out wires 501, 503, and 505 shown in FIG. 12 may correspond to the second diagonal portion of each of the first, third, and fifth fan-out wires 501, 503, and 505 located in the second diagonal region 90 of FIG. 7.

In some exemplary embodiments, the first gate electrode 170 and the lower fan-out wires may be located at the same layer. Each of the lower fan-out wires may include a metal, an alloy, metal nitride, conductive metal oxide, a transparent conductive material, and the like. These may be used alone or in combination with each other. In other exemplary embodiments, each of the lower fan-out wires may have a multilayer structure including a plurality of layers.

The first interlayer insulating layer 190 may be disposed on the first gate electrode 170 and the lower fan-out wires. The first interlayer insulating layer 190 may extend from the display region 10 to the peripheral region 20 and cover the first gate electrode 170 in the display region 10, which is on the gate insulating layer 150. In addition, the first interlayer insulating layer 190 may cover the lower fan-out wires in the peripheral region 20 that are on the gate insulating layer 150. In some exemplary embodiments, the first interlayer insulating layer 190 may be disposed along a profile of the first gate electrode 170 and the lower fan-out wires with a uniform (or substantially uniform) thickness to cover the first gate electrode 170 and the lower fan-out wires that are on the gate insulating layer 150. In some embodiments, the first interlayer insulating layer 190 may cover the first gate electrode 170 and the lower fan-out wires on the gate insulating layer 150, and may have a substantially flat top surface without creating a step around the first gate electrode 170 and the lower fan-out wires. The first interlayer insulating layer 190 may include a silicon compound, metal oxide, and/or the like. In other exemplary embodiments, the first interlayer insulating layer 190 may have a multilayer structure having a plurality of insulating layers including materials, which are different from each other.

The second gate electrode 175 may be disposed on the first interlayer insulating layer 190 in the display region 10. The second gate electrode 175 may be disposed on a portion of the first interlayer insulating layer 190 under which the first gate electrode 170 is located. In some embodiments, the first gate electrode 170 and the second gate electrode 175 may function as the storage capacitor CST of FIG. 9. The second gate electrode 175 may include a metal, an alloy, metal nitride, conductive metal oxide, a transparent conductive material, and the like. These may be used alone or in combination with each other. In other exemplary embodiments, the second gate electrode 175 may have a multilayer structure including a plurality of layers.

The second, fourth, and sixth fan-out wires 502, 504, and 506 (e.g., the upper fan-out wires) may be disposed on the first interlayer insulating layer 190 in the peripheral region 20. The upper fan-out wires may be spaced apart from each other without overlapping the lower fan-out wires. The section of each of the first, third, and fifth fan-out wires 501, 503, and 505 shown in FIG. 10 may correspond to the straight portion of each of the first, third, and fifth fan-out wires 501, 503, and 505 located in the straight region 80 of FIG. 7. In addition, a section of each of the first, third, and fifth fan-out wires 501, 503, and 505 shown in FIG. 12 may correspond to the second diagonal portion of each of the first, third, and fifth fan-out wires 501, 503, and 505 located in the second diagonal region 90 of FIG. 7. For example, a section of each of the second, fourth, and sixth fan-out wires 502, 504, and 506 shown in FIG. 10 may correspond to the straight portion of each of the second, fourth, and sixth fan-out wires 502, 504, and 506 of FIG. 7. In addition, the section of the fourth fan-out wire 504 shown in FIG. 11 may correspond to the first diagonal portion, the straight portion, or the second diagonal portion of the fourth fan-out wire 504, which are respectively located in the first diagonal region 70, the straight region 80, and the second diagonal region 90 of FIG. 7. Furthermore, the section of each of the second, fourth, and sixth fan-out wires 502, 504, and 506 shown in FIG. 12 may correspond to the second diagonal portion of each of the second, fourth, and sixth fan-out wires 502, 504, and 506 located in the second diagonal region 90 of FIG. 7.

In some exemplary embodiments, the second gate electrode 175 and the upper fan-out wires may be located at the same layer. Each of the upper fan-out wires may include a metal, an alloy, metal nitride, conductive metal oxide, a transparent conductive material, and the like. These may be used alone or in combination with each other. In other exemplary embodiments, each of the upper fan-out wires may have a multilayer structure including a plurality of layers.

The fan-out wires 500 including the first, third, and fifth fan-out wires 501, 503, and 505 and the second, fourth, and sixth fan-out wires 502, 504, and 506 may be disposed to be apart from one another. In some embodiments, the first, third, and fifth fan-out wires 501, 503, 505 may be spaced apart from each other at the same layer, and the second, fourth, and sixth fan-out wires 502, 504, and 506 may be spaced apart from each other at the same layer.

The second interlayer insulating layer 195 may be disposed on the second gate electrode 175 and the upper fan-out wires. The second interlayer insulating layer 195 may extend from the display region 10 to the peripheral region 20 and cover the second gate electrode 175, which is on the first interlayer insulating layer 190 in the display region 10. In addition, the second interlayer insulating layer 195 may cover the upper fan-out wires, which are on the first interlayer insulating layer 190 in the peripheral region 20. In some exemplary embodiments, the second interlayer insulating layer 195 may be disposed along a profile of the second gate electrode 175 and the upper fan-out wires with a uniform (or substantially uniform) thickness to cover the second gate electrode 175 and the upper fan-out wires, which are on the first interlayer insulating layer 190. In some embodiments, the second interlayer insulating layer 195 may cover the second gate electrode 175 and the upper fan-out wires on the first interlayer insulating layer 190, and may have a substantially flat top surface without creating a step around the second gate electrode 175 and the upper fan-out wires. The second interlayer insulating layer 195 may include a silicon compound, a metal oxide, and/or the like.

The source electrode 210 and the drain electrode 230 may be disposed in the sub-pixel circuit region 30 and on (e.g., at least partially on) the second interlayer insulating layer 195. The source electrode 210 may be connected to the source region of the active layer 130 through a contact hole (or contact opening) formed by removing first portions of the gate insulating layer 150, the first interlayer insulating layer 190, and the second interlayer insulating layer 195. The drain electrode 230 may be connected to the drain region of the active layer 130 through a contact hole (or contact opening) formed by removing second portions of the gate insulating layer 150, the first interlayer insulating layer 190, and the second interlayer insulating layer 195. Each of the source electrode 210 and the drain electrode 230 may include a metal, an alloy, metal nitride, conductive metal oxide, a transparent conductive material, and the like. These may be used alone or in combination with each other. In other exemplary embodiments, each of the source electrode 210 and the drain electrode 230 may have a multilayer structure including a plurality of layers.

The semiconductor element 250 may include the active layer 130, the gate insulating layer 150, the first gate electrode 170, the first interlayer insulating layer 190, the second gate electrode 175, the second interlayer insulating layer 195, the source electrode 210, and the drain electrode 230.

Although the semiconductor element 250 has been described as having a top gate structure, the configuration of the present invention is not limited thereto, and the semiconductor element 250 may have any other suitable structure. For example, the semiconductor element 250 may have a bottom gate structure.

In addition, although the organic light emitting diode display device 100 has been described as including one semiconductor element, the configuration of the present invention is not limited thereto. For example, the organic light emitting diode display device 100 may include at least one semiconductor element and at least one storage capacitor.

The first sub-power supply wire 361 may be disposed in the peripheral region 20 and on the second interlayer insulating layer 195. In some exemplary embodiments, the first sub-power supply wire 361 may be disposed along a profile of the second interlayer insulating layer 195 with a uniform (or substantially uniform) thickness to cover the second interlayer insulating layer 195 in the peripheral region 20. In addition, the low power supply voltage may be applied to the first sub-power supply wire 361. The first sub-power supply wire 361 may include a metal, an alloy, metal nitride, conductive metal oxide, a transparent conductive material, and/or the like. For example, the first sub-power supply wire 361 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In some exemplary embodiments, the first sub-power supply wire 361 may be located at the same layer as the source and drain electrodes 210 and 230. In other exemplary embodiments, the first sub-power supply wire 361 may have a multilayer structure including a plurality of layers.

The first planarization layer 270 may be disposed on the second interlayer insulating layer 195, the first sub-power supply wire 361, the source electrode 210, and the drain electrode 230. The first planarization layer 270 may extend to the peripheral region 20 and cover the source electrode 210 and the drain electrode 230 in the display region 10, which are on (e.g., at least partially on) the second interlayer insulating layer 195. In some exemplary embodiments, the first planarization layer 270 may have an opening 280 that exposes a top surface of the first sub-power supply wire 361 in the straight region 80 (e.g., see FIGS. 5, 7, and 11). As shown in FIGS. 10 and 11, the first sub-power supply wire 361 and the second sub-power supply wire 362 may make direct contact with each other through the opening 280. As shown in FIG. 12, in the second diagonal region 90 and the first diagonal region 70, the first planarization layer 270 may be interposed between the first sub-power supply wire 361 and the second sub-power supply wire 362.

For example, the first planarization layer 270 may be disposed in the display region 10 and the peripheral region 20 with a relatively large thickness. In this case, the first planarization layer 270 may have a substantially flat top surface. To implement such a flat top surface of the first planarization layer 270, a planarization process may be additionally performed on the first planarization layer 270. In some embodiments, the first planarization layer 270 may be disposed along a profile of the first sub-power supply wire 361, the source electrode 210, and the drain electrode 230 with a uniform (or substantially uniform) thickness. The first planarization layer 270 may be formed of an organic material or an inorganic material in the display region 10 and the peripheral region 20 and may be on the second interlayer insulating layer 195. In some exemplary embodiments, the first planarization layer 270 may include an organic material. For example, the first planarization layer 270 may include a photoresist, a polyacryl-based resin, a polyimide-based resin, a polyamide-based resin, a siloxane-based resin, an acryl-based resin, an epoxy-based resin, and/or the like.

The wiring pattern 215 and the connection pattern 235 may be disposed on the first planarization layer 270 in the display region 10. The wiring pattern 215 may transfer the gate signal, the data signal, the light emission control signal, the gate initialization signal, the power supply voltage, and/or the like. The connection pattern 235 may be spaced apart from the wiring pattern 215, which is on the first planarization layer 270 in the display region 10. The connection pattern 235 may be connected to the drain electrode 230 through a contact hole (or contact opening) formed by removing a portion of the first planarization layer 270 located in the display region 10, and the connection pattern 235 may electrically connect the lower electrode 290 to the drain electrode 230. In some embodiments, the connection pattern 235 may not be connected to the drain electrode 230, and may electrically connect the semiconductor element 250 to another semiconductor element through the contact hole (or contact opening) in another sectional view of the organic light emitting diode display device 100. Each of the wiring pattern 215 and the connection pattern 235 may include a metal, an alloy, metal nitride, conductive metal oxide, a transparent conductive material, and the like. These may be used alone or in combination with each other. In other exemplary embodiments, each of the wiring pattern 215 and the connection pattern 235 may have a multilayer structure including a plurality of layers.

The second sub-power supply wire 362 may be disposed on the first planarization layer 270 in the peripheral region 20. In some exemplary embodiments, the second sub-power supply wire 362 may make direct contact with the first sub-power supply wire 361 through the opening 280, and may be electrically connected to the first sub-power supply wire 361. Accordingly, the low power supply voltage applied to the first sub-power supply wire 361 may be provided to the second sub-power supply wire 362, and the low power supply voltage may be provided to the upper electrode 340. The second sub-power supply wire 362 may include a metal, an alloy, metal nitride, conductive metal oxide, a transparent conductive material, and the like. These may be used alone or in combination with each other. In some exemplary embodiments, the wiring pattern 215, the connection pattern 235, and the second sub-power supply wire 362 may be located at the same layer. In other exemplary embodiments, the second sub-power supply wire 362 may have a multilayer structure including a plurality of layers.

The power supply wire 350 may include the first sub-power supply wire 361 and the second sub-power supply wire 362.

In some exemplary embodiments, as shown in FIG. 10, the straight portion of each of the fan-out wires 500 is disposed in the straight region 80, so that the interval between the fan-out wires 500 may be relatively increased. In this case, because a V-shaped stepped portion is not generated, the second sub-power supply wire 362 may be relatively less affected by the profile of the fan-out wires 500 in the straight region 80, and cracks may not be generated in the second sub-power supply wire 362 formed in the opening 280.

The second planarization layer 275 may be disposed on the wiring pattern 215, the connection pattern 235, the second sub-power supply wire 362, and the first planarization layer 270. The second planarization layer 275 may extend from the display region 10 to the peripheral region 20 and cover the wiring pattern 215 and the connection pattern 235 in the display region 10, which are on the first planarization layer 270, and may cover the second sub-power supply wire 362 in the peripheral region 20. In other words, the second planarization layer 275 may be disposed over the substrate 110. In some embodiments, the second planarization layer 275 may be disposed only in the display region 10 and on the first planarization layer 270 without being disposed on the second sub-power supply wire 362 in the peripheral region 20.

The second planarization layer 275 may have a relatively large thickness to cover the wiring pattern 215, the connection pattern 235, and the second sub-power supply wire 362. In this case, the second planarization layer 275 may have a substantially flat top surface. To implement such a flat top surface of the second planarization layer 275, the planarization process may be additionally performed on the second planarization layer 275. In some embodiments, the second planarization layer 275 may be disposed along a profile of the wiring pattern 215, the connection pattern 235, and the second sub-power supply wire 362 with a uniform (or substantially uniform) thickness to cover the wiring pattern 215, the connection pattern 235, and the second sub-power supply wire 362. The second planarization layer 275 may be formed of an organic material or an inorganic material. In some exemplary embodiments, the second planarization layer 275 may include an organic material.

The lower electrode 290 may be disposed on the second planarization layer 275 in the display region 10. The lower electrode 290 may be connected to the connection pattern 235 through a contact hole (or contact opening) formed by removing a portion of the second planarization layer 275, and the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In other exemplary embodiments, the lower electrode 290 may have a multilayer structure including a plurality of layers.

The pixel defining layer 310 may be disposed on the second planarization layer 275 in the display region 10, and may extend from the display region 10 to the peripheral region 20 while exposing a portion of the lower electrode 290. In some embodiments, the pixel defining layer 310 may be disposed only in the display region 10 without being disposed in the peripheral region 20. The pixel defining layer 310 may be formed of an organic material or an inorganic material. In some exemplary embodiments, the pixel defining layer 310 may include an organic material.

The light emitting layer 330 may be disposed on the lower electrode 290 that is partially exposed by the pixel defining layer 310. The light emitting layer 330 may be formed by using at least one of light emitting materials for emitting different color lights (e.g., red light, green light, blue light, etc.) corresponding to the sub-pixels. In some embodiments, the light emitting layer 330 may be formed by laminating a plurality of light emitting materials for emitting the different color lights such as a red light, a green light, and a blue light to be capable of emitting a white light as a whole. In this case, a color filter may be disposed on the light emitting layer 330. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the pixel defining layer 310 and the light emitting layer 330 in the display region 10. The upper electrode 340 may include a metal, an alloy, metal nitride, conductive metal oxide, a transparent conductive material, and the like. These may be used alone or in combination with each other. In other exemplary embodiments, the upper electrode 340 may have a multilayer structure including a plurality of layers.

The sub-pixel structure 200 may include the lower electrode 290, the light emitting layer 330, and the upper electrode 340.

The first thin film encapsulation layer 451 may be disposed on the upper electrode 340 in the display region 10, and on the pixel defining layer 310 in the peripheral region 20. The first thin film encapsulation layer 451 may be disposed along a profile of the upper electrode 340 with a uniform (or substantially uniform) thickness to cover the upper electrode 340 in the display region 10, and may be disposed along a profile of the pixel defining layer 310 with a uniform (or substantially uniform) thickness to cover the pixel defining layer 310 in the peripheral region 20. In some embodiments, the first thin film encapsulation layer 451 may not be disposed in the peripheral region 20. The first thin film encapsulation layer 451 may prevent the sub-pixel structure 200 from being degraded or substantially reduce degradation thereof due to penetration of moisture, oxygen, and/or the like. In addition, the first thin film encapsulation layer 451 may function to protect the sub-pixel structure 200 from an external impact. The first thin film encapsulation layer 451 may include inorganic materials having flexibility.

The second thin film encapsulation layer 452 may be disposed on the first thin film encapsulation layer 451 in the display region 10 and the peripheral region 20. In some embodiments, the second thin film encapsulation layer 452 may not be disposed in the peripheral region 20. The second thin film encapsulation layer 452 may improve (e.g., increase) the flatness of the organic light emitting diode display device 100 and may protect the sub-pixel structure 200. The second thin film encapsulation layer 452 may include organic materials having flexibility.

The third thin film encapsulation layer 453 may be disposed on the second thin film encapsulation layer 452 in the display region 10 and the peripheral region 20. The third thin film encapsulation layer 453 may be disposed along a profile of the second thin film encapsulation layer 452 with a uniform (or substantially uniform) thickness to cover the second thin film encapsulation layer 452. In some embodiments, the third thin film encapsulation layer 453 may not be disposed in the peripheral region 20. The third thin film encapsulation layer 453 may prevent the sub-pixel structure 200 from being degraded or substantially reduce degradation thereof due to the penetration of moisture, oxygen, or the like together with the first thin film encapsulation layer 451. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may include inorganic materials having flexibility.

The thin film encapsulation structure 450 may include the first thin film encapsulation layer 451, the second thin film encapsulation layer 452, and the third thin film encapsulation layer 453.

In some embodiments, the thin film encapsulation structure 450 may have a five-layer structure in which first to fifth thin film encapsulation layers are stacked or a seven-layer structure in which first to seventh thin film encapsulation layers are stacked.

As described above, the organic light emitting diode display device 100 shown in FIGS. 1 to 12 may be provided.

The organic light emitting diode display device 100 according to the exemplary embodiments of the present invention includes the fan-out wires 500, in which each of the fan-out wires 500 includes a straight portion, so that the interval between the fan-out wires 500 may be relatively increased. Accordingly, the opening 280 is formed in the first planarization layer 270 to overlap the straight portion, so that the first sub-power supply wire 361 and the second sub-power supply wire 362 may easily make contact with each other in the peripheral region 20 without forming cracks on the second sub-power supply wire 362.

Figure 13:
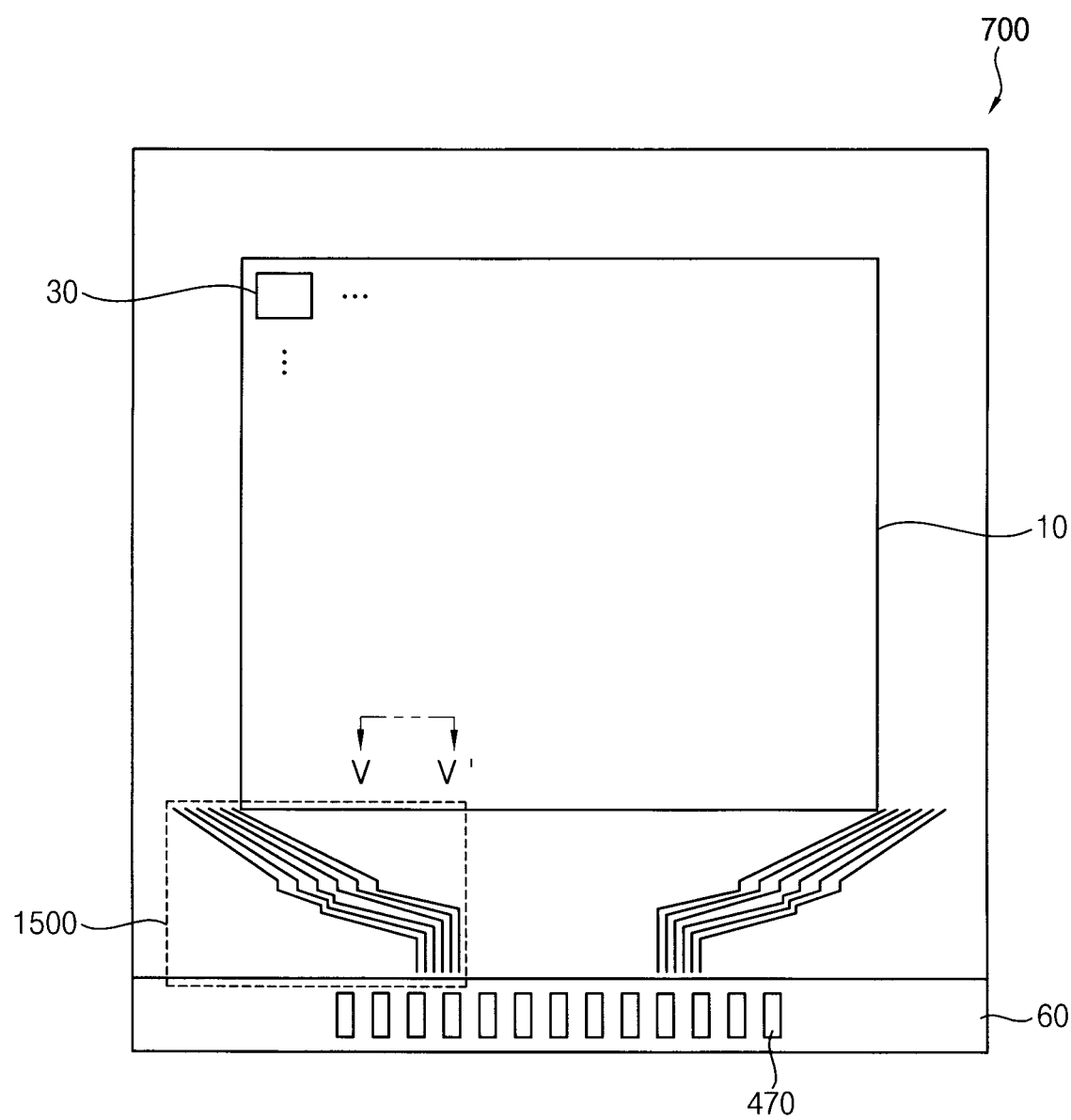
FIG. 13 is a plan view showing the organic light emitting diode display device according to some exemplary embodiments of the present invention.
Figure 14:
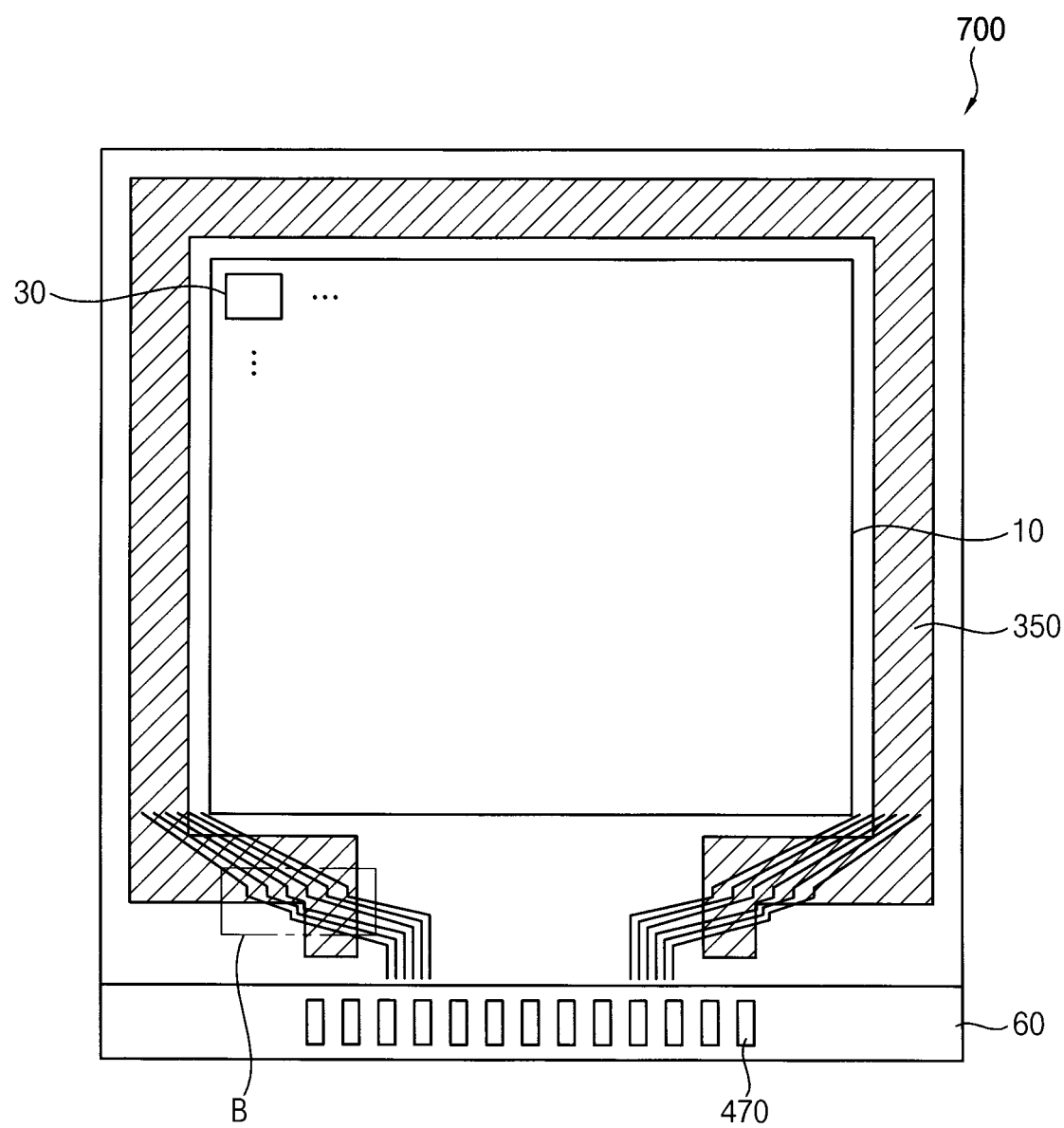
FIGS. 14 and 15 are plan views for illustrating the power supply wire and the opening overlapping the power supply wire, which are included in the organic light emitting diode display device.
Figure 15:
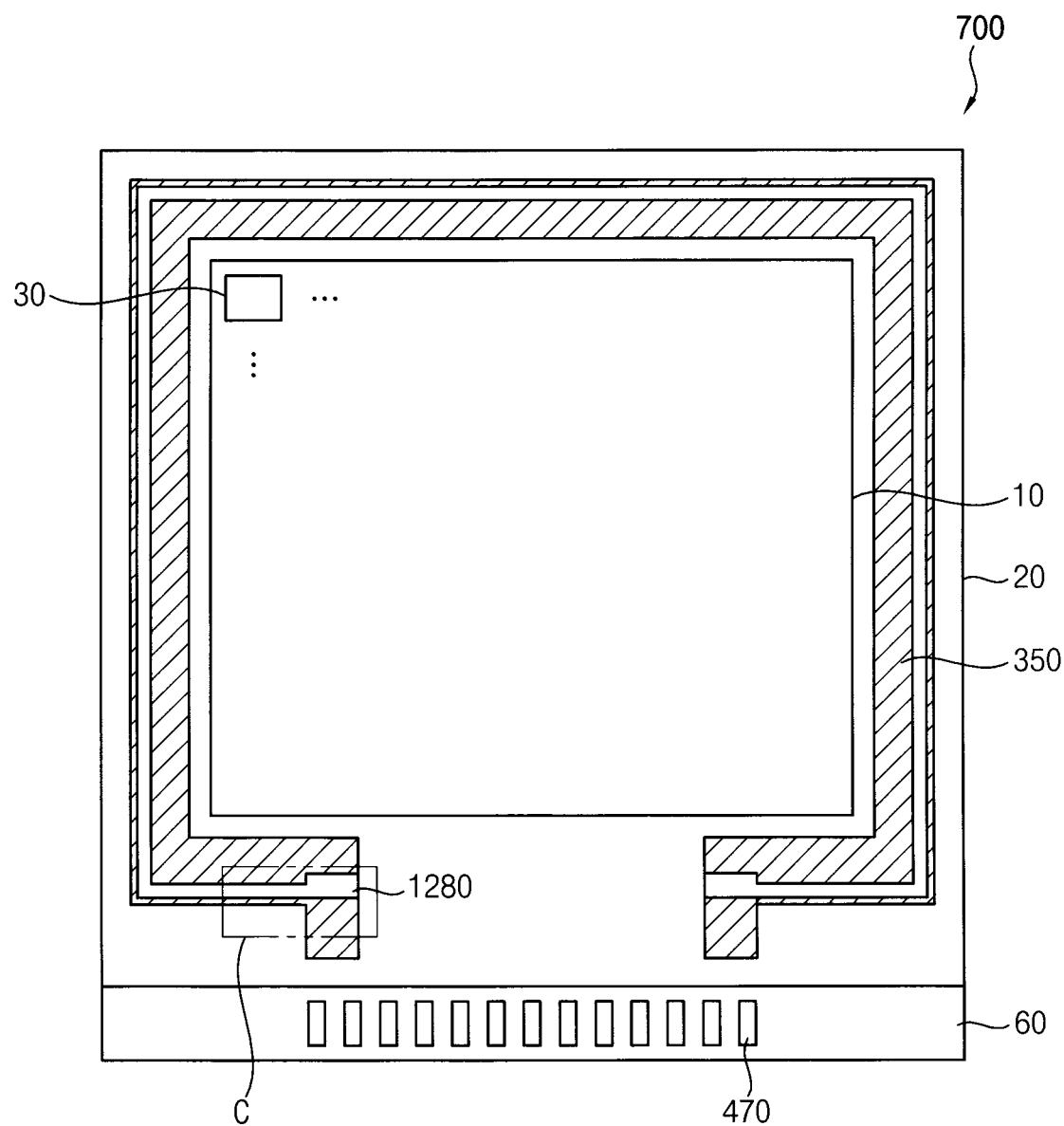
Figure 16:
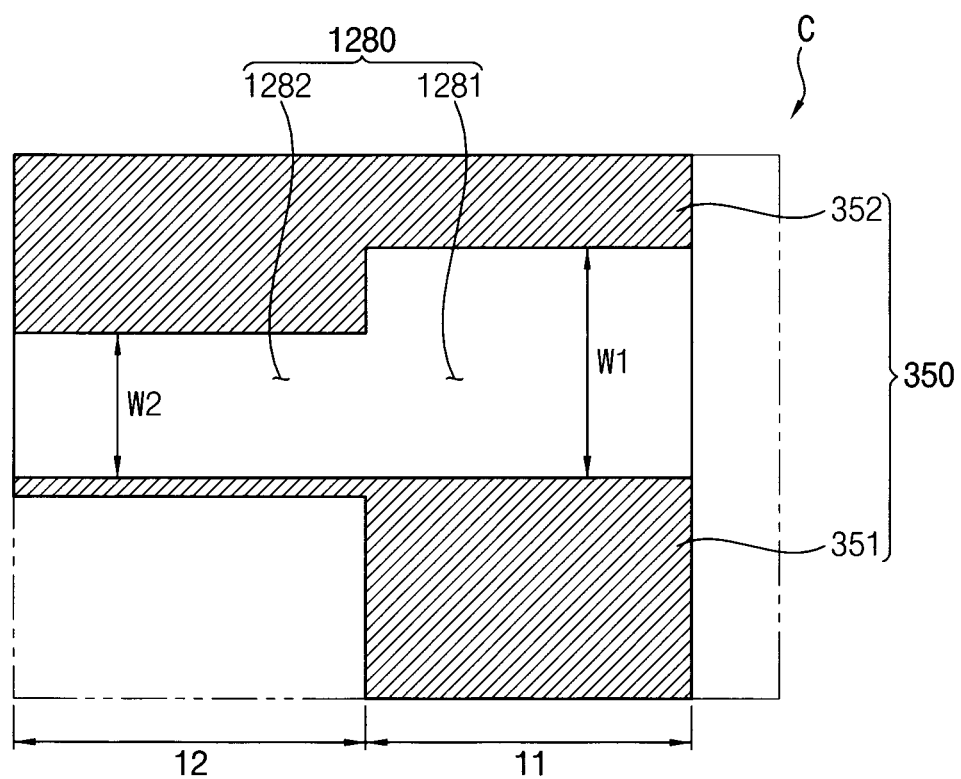
FIG. 16 is a partially enlarged plan view showing the region 'C' of FIG. 15.
Figure 16:
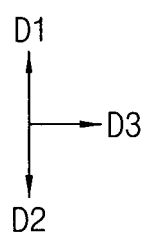

FIG. 13 is a plan view showing the organic light emitting diode display device according to the exemplary embodiments of the present invention; FIGS. 14 and 15 are plan views for illustrating the power supply wire and the opening overlapping the power supply wire, which are included in the organic light emitting diode display device; and FIG. 16 is a partially enlarged plan view showing the region 'C' of FIG. 15. An organic light emitting diode display device 700 illustrated in FIGS. 13, 14, 15, and 16 may have a configuration substantially identical or similar to the organic light emitting diode display device 100 described with reference to FIGS. 1 to 12, except for fan-out wires 1500 and an opening 1280. In FIGS. 13, 14, 15, and 16, repetitive descriptions for elements substantially identical or similar to the elements described with reference to FIGS. 1 to 12 may be omitted.

Referring to FIGS. 1, 2, 13, 14, 15, and 16, the organic light emitting diode display device 700 may include the power supply wire 350, the fan-out wires 1500, the pad electrodes 470, and the like, and may have the display region 10, the peripheral region 20, and the pad region 60. In this case, as shown in FIG. 1, the peripheral region 20 may substantially surround (e.g., be around) the display region 10 in a plan view, and the pad region 60 may be located on one side of the peripheral region 20. In addition, the display region 10 may include a plurality of sub-pixel circuit regions 30, and the peripheral region 20 may include the first peripheral region 21 and the second peripheral region 22. For example, the first peripheral region 21 may be located between the pad region 60 and the display region 10 in correspondence with (e.g., next to) the pad electrodes 470 disposed in the pad region 60. In addition, the second peripheral region 22 may correspond to the remaining portion of the peripheral region 20 outside of the first peripheral region 21. In other words, the first peripheral region 21 and the second peripheral region 22 may be different from each other, and may not overlap each other. For example, the peripheral region 20 may have a hollow rectangular planar shape (e.g., a rectangular frame shape) when viewed in a plan view. In other words, the peripheral region 20 may have a rectangular shape having an opening that exposes the display region 10 when viewed in a plan view.

In some exemplary embodiments, as shown in FIGS. 14 and 15, the power supply wire 350 may be disposed in a portion of the peripheral region 20. In other words, the power supply wire 350 may be disposed in a portion of the first peripheral region 21 and the second peripheral region 22. The power supply wire 350 may have an annular or rectangular frame shape with an open bottom. In some exemplary embodiments, an opening 1280 of the first planarization layer 270, which will be described below, may be located along the outer profile of the power supply wire 350. In other words, the opening 1280 may at least partially surround the display region 10 in a plan view. The power supply wire 350 may be electrically connected to the pad electrodes 470 in the first peripheral region 21. For example, the power supply wire 350 may be electrically connected to one of the pad electrodes 470 that are located at the outermost portion of the pad electrodes 470. The low power supply voltage may be applied to the power supply wire 350, and the low power supply voltage may be provided to the cathode electrode (e.g., the upper electrode 340 of FIGS. 19 and 20).

In addition, the power supply wire 350 may include: a first wire portion 351 next to the pad electrodes 470 in the first peripheral region 21, and a second wire portion 352 located in a portion of the first peripheral region 21 and the second peripheral region 22. In other words, the second wire portion 352 may include: first extension portions (e.g., two first extension portions) extending in a first direction D1 from the second peripheral region 22 adjacent to left and right sides of the display region 10; a second extension portion extending in a third direction D3 from the second peripheral region 22 adjacent to an upper side of the display region 10; and third extension portions extending in the third direction D3 from the second peripheral region 22 and a portion of the first peripheral region 21 adjacent to a lower side of the display region 10. The first to third extension portions may be located along an outer profile of the display region 10. In this case, the second extension portion may be located between the first extension portions, the third extension portions may be substantially parallel to the second extension portion, and the first direction D1 and the third direction D3 may be substantially orthogonal to each other. For example, the second wire portion 352 may at least partially surround the display region 10 in a plan view, and may have the annular or rectangular frame shape with the open bottom. The first wire portion 351 may have a shape protruding from a portion where the bottom of the second wire portion 352 is opened (e.g., a terminal portion of each of the third extension portions) in a direction from the display region 10 to the pad region 60 (e.g., in a second direction D2 opposite to the first direction D1). The first wire portion 351 and the second wire portion 352 may be integrally formed (e.g., formed as one unitary body). In some embodiments, the first wire portion 351 and the second wire portion 352 may be formed by connecting mutually different wires to each other. In some exemplary embodiments, the opening 280 may be formed along an outer profile of the second wire portion 352 without being disposed in the first wire portion 351. In some exemplary embodiments, as shown in FIG. 16, the opening 1280 may include: a first opening 1281 formed in a first outer peripheral portion 11 of the second wire portion 352, which is adjacent to the first wire portion 351, and having a first width W1; and a second opening 1282 formed in a second outer peripheral portion 12 of the second wire portion 352, which is not adjacent to the first wire portion 351, and having a second width W2 smaller than the first width W1. The first opening 1281 and the second opening 1282 may be integrally formed (e.g., formed of one continuous opening).

Furthermore, as shown in FIGS. 13 and 14, fan-out wires 1500 may be disposed in the first peripheral region 21 and a portion of the second peripheral region 22. The fan-out wires 1500 may be disposed under the power supply wire 350. In some exemplary embodiments, the fan-out wires 1500 may include: first fan-out wires 1501 overlapping the first opening 1281, and second fan-out wires 1502 overlapping the second opening 1282 (e.g., see FIG. 17). Each of the fan-out wires 1500 may include a first diagonal portion, a first straight portion, and a second diagonal portion, and the opening 1280 may overlap a portion where the first straight portion is disposed in the peripheral region 20 adjacent to the pad region 60. For example, the first diagonal portion may be adjacent to the pad electrodes 470, the second diagonal portion may be adjacent to the display region 10, the first straight portion may be located between the first and second diagonal portions, and the first diagonal portion, the first straight portion, and the second diagonal portion may be integrally formed (e.g., formed as one unitary body). In some exemplary embodiments, each of the second fan-out wires 1502 may further include a second straight portion, the first diagonal portion of each of the second fan-out wires 1502 may include an upper diagonal portion connected to the first straight portion and a lower diagonal portion adjacent to the pad electrodes 470, the second straight portion may be located between the upper diagonal portion and the lower diagonal portion, and the upper diagonal portion, the second straight portion, and the lower diagonal portion may be integrally formed (e.g., formed as one unitary body).

Compared to the organic light emitting diode display device 100 of FIGS. 1 to 12, the organic light emitting diode display device 700 may have the first opening 1281 having the first width W1 that is relatively increased in the first outer peripheral portion 11 (e.g., with respect to the second width W2). For example, the low power supply voltage ELVSS may be applied from the pad electrodes 470 to the first wire portion 351, and a current may be concentrated in a portion in which the first wire portion 351 is adjacent to the second wire portion 352 (e.g., a current concentration region). In this case, a heat generation phenomenon may occur in the current concentration region, and a sub-pixel structure near the current concentration region, which is configured to emit a blue light, may be rapidly degraded due to the heat generation phenomenon. Accordingly, because the first opening 1281 located in the current concentration region has a relatively large area, a contact area of the first sub-power supply wire 361 and the second sub-power supply wire 362 is relatively increased, so that a contact resistance may be reduced, and the heat generation phenomenon may not occur in the current concentration region. In this case, as the length of the first straight portion of each of the first fan-out wires 1501 is relatively increased, each of the second fan-out wires 1502 also includes the second straight portion, so that the relatively increased length of the first fan-out wires 1501 may be the same as the relatively increased length of the second fan-out wires 1502.

In FIGS. 13 and 14, although the fan-out wires 1500 are shown as including twelve fan-out wires for convenience, the fan-out wires 1500 may be additionally provided in the peripheral region 20 adjacent to the pad region 60. However, for convenience of explanation, the fan-out wires 1500 will be described as including six fan-out wires located on the left side of the peripheral region 20 adjacent to the pad region 60. The fan-out wires 1500 may conduct the gate signal, the data signal, the light emission control signal, the gate initialization signal, the initialization voltage, and/or the like.

For example, fan-out wires that do not overlap the opening 1280 (e.g., an outermost fan-out wire disposed at an outermost portion of the peripheral region 20) from among the additionally provided fan-out wires may be further provided in the peripheral region 20. Because lengths of the fan-out wires 1500 have been relatively increased, the outermost fan-out wire may further include a straight portion, and the relatively increased lengths of the fan-out wires 500 may be the same as an increased length of the outermost fan-out wire.

In other exemplary embodiments, the high power supply wire may be disposed in a portion of the peripheral region 20. In other words, the high power supply wire may be disposed in a portion of the first peripheral region 21, and may be disposed between the power supply wires 350 in the first peripheral region 21. In some embodiments, the high power supply wire may extend from the first peripheral region 21 to the display region 10, and may have a lattice shape in the display region 10. The high power supply wire may be electrically connected to the pad electrodes 470 in the first peripheral region 21. For example, the high power supply wire may be electrically connected to the pad electrodes 470 located on an inner side the pad electrodes 470, which are connected to the power supply wire 350 from among the pad electrodes 470. The high power supply voltage may be applied to the high power supply wire, and the high power supply voltage may be provided to an anode electrode (e.g., the lower electrode 290 of FIGS. 19 and 20).

Figure 17:
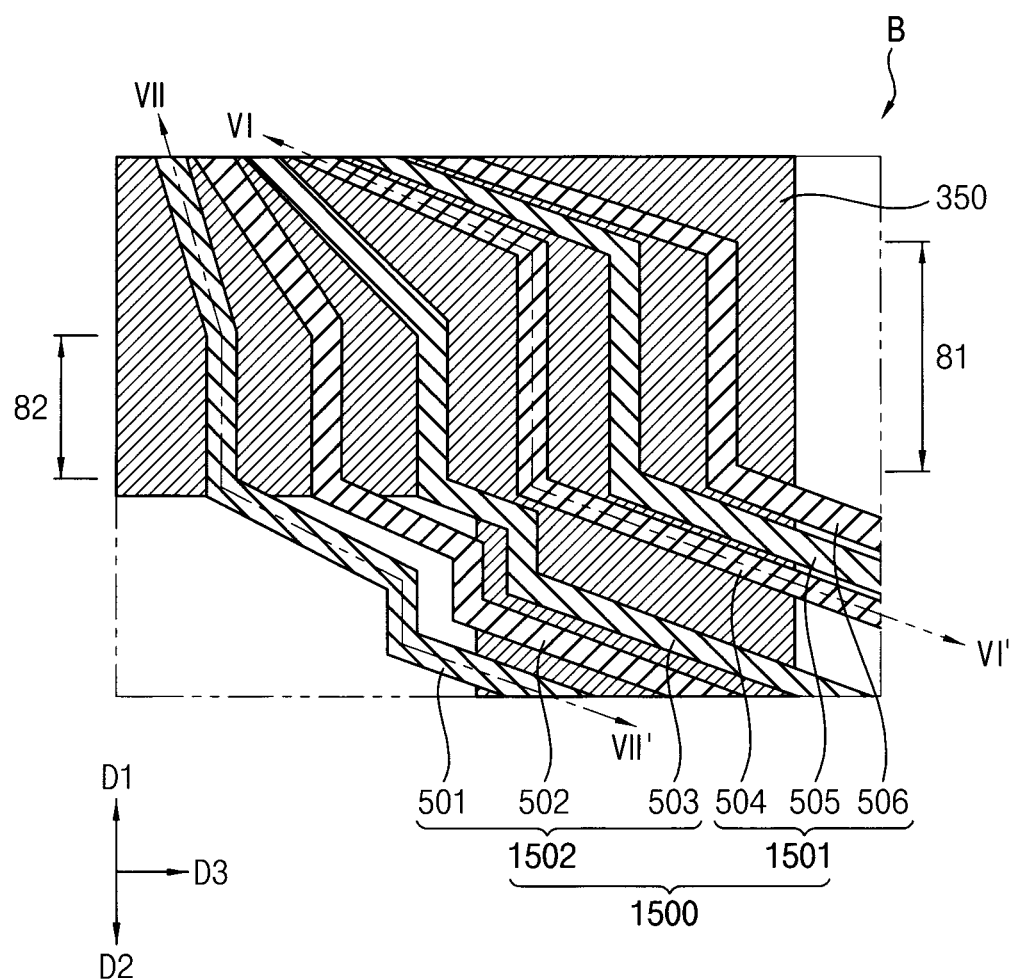
FIG. 17 is a partially enlarged plan view showing the region 'B' of FIG. 14.
Figure 18:
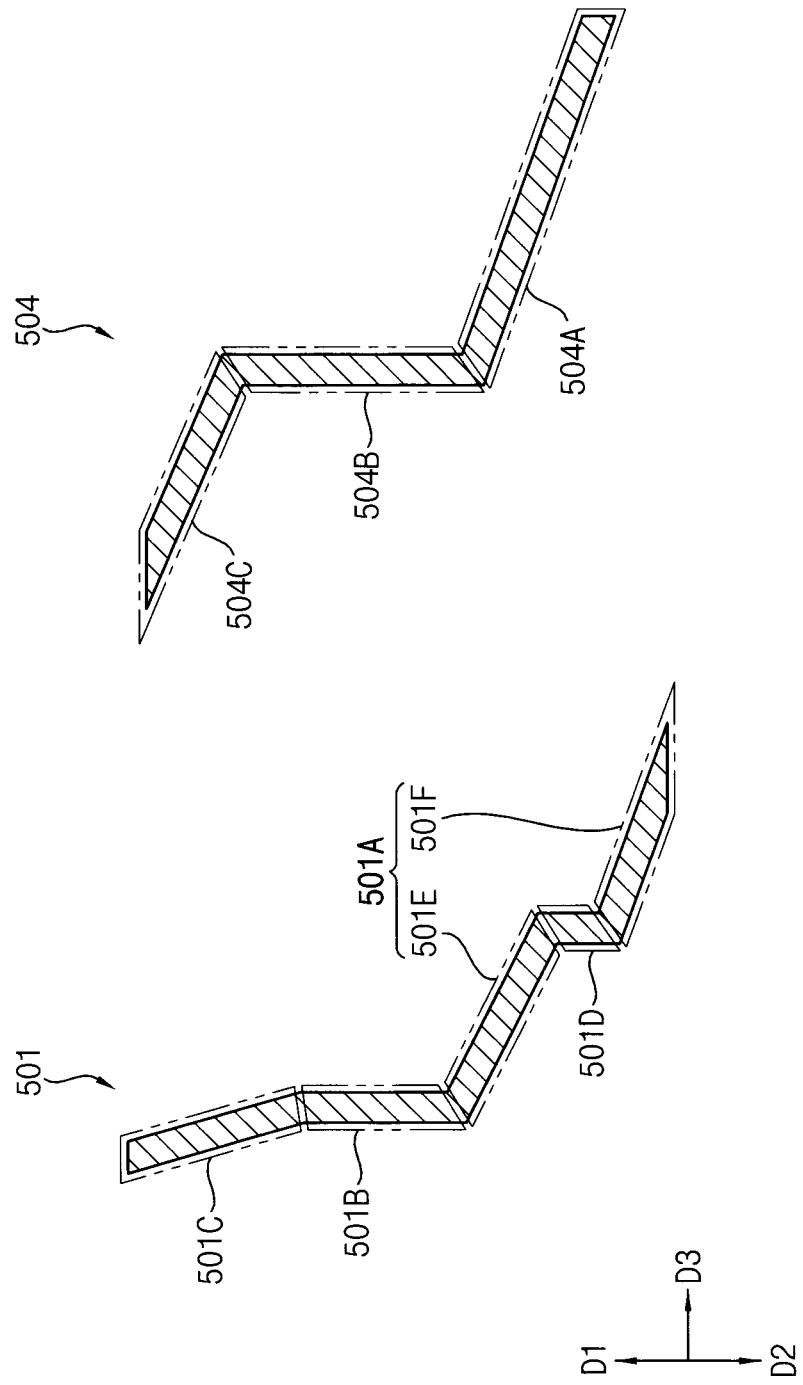
FIG. 18 is a plan view for illustrating the fan-out wires shown in FIG. 17.

FIG. 17 is a partially enlarged plan view showing the region 'B' of FIG. 14, and FIG. 18 is a plan view for illustrating the fan-out wires shown in FIG. 17.

Referring to FIGS. 17 and 18, the fan-out wires 1500 may include first to sixth fan-out wires 501, 502, 503, 504, 505, and 506. Each of the fan-out wires 1500 may include a first diagonal portion, a first straight portion, and a second diagonal portion. The first straight portion may extend in the first direction D1, and the first and second diagonal portions may extend in a direction different from the extension direction of the straight portion. The first and second diagonal portions and the first straight portion may be integrally formed (e.g., formed as one unitary body).

As described above, the fan-out wires 1500 may include the first fan-out wires 1501 and the second fan-out wires 1502. The first fan-out wires 1501 may include fourth, fifth, and sixth fan-out wires 504, 505, and 506, and the second fan-out wires 1502 may include first, second, and third fan-out wires 501, 502, and 503. In this case, a portion where the first opening 1281 is formed, is defined as a first straight region 81, and a portion where the second opening 1282 is formed, is defined as a second straight region 82. For example, the first straight portion of each of the first fan-out wires 1501 may be located in the first straight region 81, and the first straight portion of each of the second fan-out wires 1502 may be located in the second straight region 82. In other words, at least two fan-out wires may be disposed under a portion overlapping the opening 1280. In some exemplary embodiments, each of the second fan-out wires 1502 may further include a second straight portion, the first diagonal portion of each of the second fan-out wires 1502 may include an upper diagonal portion connected to the first straight portion and a lower diagonal portion adjacent to the pad electrodes 470, the second straight portion may be located between the upper diagonal portion and the lower diagonal portion, and the upper diagonal portion, the second straight portion, and the lower diagonal portion may be integrally formed (e.g., formed as one unitary body).

Referring to the fourth fan-out wire 504 shown on a right side of FIG. 18, the fourth fan-out wire 504 may include a first diagonal portion 504A, a first straight portion 504B, and a second diagonal portion 504C. A first end of the first diagonal portion 504A may be adjacent to the pad region 60 and may extend in a first diagonal direction, and the first straight portion 504B may extend from a second end of the first diagonal portion 504A in the first direction D1. In this case, a first end of the first straight portion 504B may be connected to the second end of the first diagonal portion 504A. In addition, the second diagonal portion 504C may extend from a second end of the first straight portion 504B in a second diagonal direction, and a second end of the second diagonal portion 504C may be connected to a wire located in the second peripheral region 22 or a wire disposed in the display region 10. In this case, the first diagonal direction and the second diagonal direction may be the same or may be different from each other. In some exemplary embodiments, a length of the first straight portion 504B may be shorter than a length of each of the first and second diagonal portions 504A and 504C.

In this manner, each of the fifth and sixth fan-out wires 505 and 506 may also have the first straight portion, the first diagonal portion, and the second diagonal portion.

Referring to the first fan-out wire 501 shown on a left side of FIG. 18, the first fan-out wire 501 may have a first diagonal portion 501A, a first straight portion 501B, and a second diagonal portion 501C. In addition, the first fan-out wire 501 may further include a second straight portion 501D, the first diagonal portion 501A of the first fan-out wire 501 may include an upper diagonal portion 501E connected to the first straight portion 501B and a lower diagonal portion 501F adjacent to the pad electrodes 470, the second straight portion 501D may be located between the upper diagonal portion 501E and the lower diagonal portion 501F, and the upper diagonal portion 501 E, the second straight portion 501D, and the lower diagonal portion 501F may be integrally formed (e.g., formed as one unitary body).

A first end of the lower diagonal portion 501F may be adjacent to the pad region 60 and may extend in the first diagonal direction, and the second straight portion 501D may extend from a second end of the lower diagonal portion 501F in the first direction D1. In this case, a first end of the second straight portion 501D may be connected to the second end of the lower diagonal portion 501F. In addition, the upper diagonal portion 501E may extend in the second diagonal direction from a second end of the second straight portion 501D, and the first straight portion 501B may extend from a second end of the upper diagonal portion 501E in the first direction D1. In this case, the first end of the first straight portion 501B may be connected to the second end of the lower diagonal portion 501F. Furthermore, the second diagonal portion 501C may extend from the second end of the first straight portion 501B in the third diagonal direction, and may be connected to a wire disposed in the second peripheral region 22 or a wire disposed in the display region 10. In this case, the first to third diagonal directions may be the same or different from each other. In some exemplary embodiments, a length of the first straight portion 501B may be shorter than a length of each of the first and second diagonal portions 504A and 504C, and a length of the second straight portion 501D may be shorter than a length of each of the upper and lower diagonal portions 501E and 501F.

In this manner, each of the second and third fan-out wires 502 and 503 may also have a first straight portion; a first diagonal portion including an upper diagonal portion, a second straight portion, and a lower diagonal portion; and a second diagonal portion.

In some exemplary embodiments, the fan-out wires 1500 may be divided into lower fan-out wires and upper fan-out wires. For example, the lower fan-out wires may include first, third, and fifth fan-out wires 501, 503, and 505, and the upper fan-out wires may include second, fourth, and sixth fan-out wires 502, 504, and 506. The upper fan-out wires may be disposed on the lower fan-out wires, and the lower fan-out wires and the upper fan-out wires may be alternately disposed without overlapping each other.

Although the fan-out wires 1500 have been described as including six fan-out wires, the configuration of the present invention is not limited thereto, and the fan-out wires 1500 may include any suitable number of fan-out wires. For example, the fan-out wires 500 may include at least seven fan-out wires.

The power supply wire 350 may be disposed in the first peripheral region 21 and a portion of the second peripheral region 22 (or the peripheral region 20 adjacent to the pad region 60) on the fan-out wires 1500. The power supply wire 350 may be disposed along the profile of the fan-out wires 1500 on the fan-out wires 1500. In some exemplary embodiments, the power supply wire 350 may include a first sub-power supply wire 361 and a second sub-power supply wire 362. In the first straight region 81 and the second straight region 82, the first sub-power supply wire 361 and the second sub-power supply wire 362 may make direct contact with each other through the opening 1280 of the first planarization layer 270 (e.g., see FIGS. 19 and 20).

Figure 19:
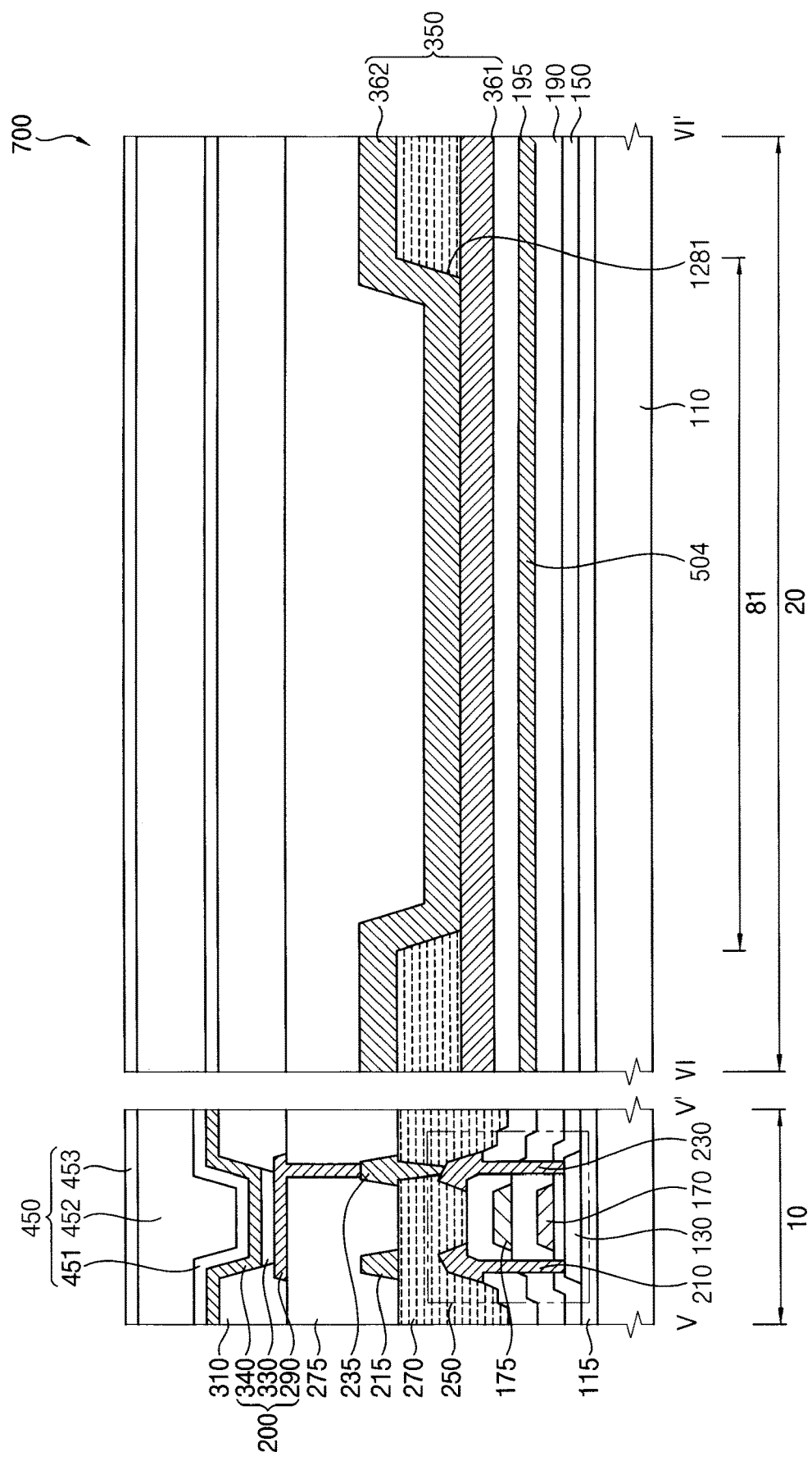
FIG. 19 is a cross-sectional view taken along the line V-V' of FIG. 13 and the line VI-VI' of FIG. 17.
Figure 20:
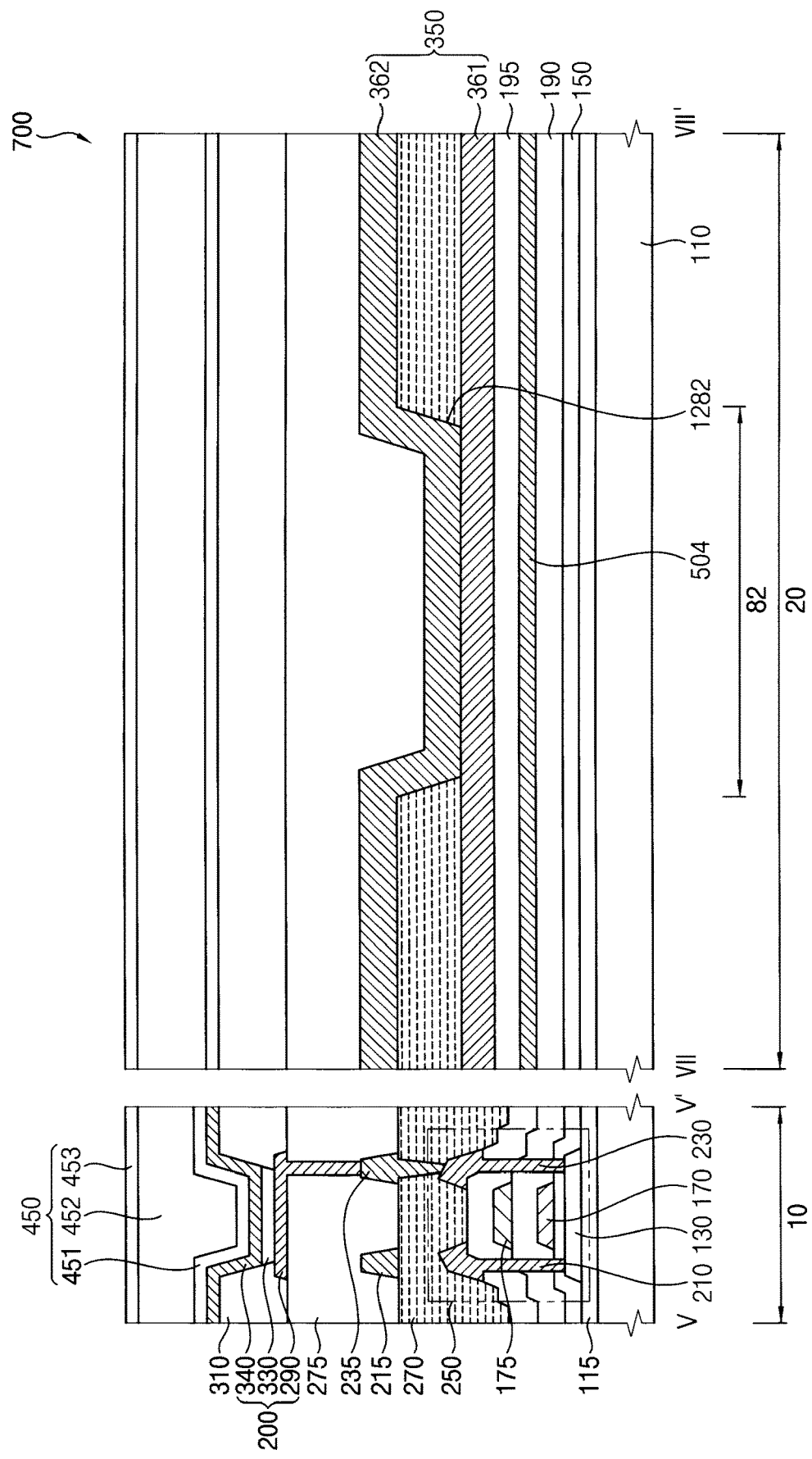
FIG. 20 is a cross-sectional view taken along the line V-V' of FIG. 13 and the line VII-VII' of FIG. 17.

FIG. 19 is a cross-sectional view taken along the line V-V' of FIG. 13 and the line VI-VI' of FIG. 17, and FIG. 20 is a cross-sectional view taken along the line V-V' of FIG. 13 and the line VII-VII' of FIG. 17.

Referring to FIGS. 17, 19, and 20, the organic light emitting diode display device 700 may include a substrate 110, a buffer layer 115, a semiconductor element 250, a sub-pixel structure 200, fan-out wires 1500, a first planarization layer 270, a power supply wire 350, a second planarization layer 275, a wiring pattern 215, a connection pattern 235, a pixel defining layer 310, a thin film encapsulation structure 450. In this case, the semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230. The fan-out wires 1500 may include first to sixth fan-out wires 501, 502, 503, 504, 505, and 506. In addition, the power supply wire 350 may include a first sub-power supply wire 361 and a second sub-power supply wire 362. The sub-pixel structure 200 may include a lower electrode 290, a light emitting layer 330, and an upper electrode 340. Furthermore, the first planarization layer 270 may have an opening 1280, and the opening 1280 may include a first opening 1281 and a second opening 1282.

The first sub-power supply wire 361 may be disposed on the second interlayer insulating layer 195 in the peripheral region 20. In some exemplary embodiments, the first sub-power supply wire 361 may be disposed on and along a profile of the second interlayer insulating layer 195 with a uniform (or substantially uniform) thickness to cover the second interlayer insulating layer 195 in the peripheral region 20. In addition, the low power supply voltage may be applied to the first sub-power supply wire 361. The first sub-power supply wire 361 may include a metal, an alloy, metal nitride, conductive metal oxide, a transparent conductive material, and the like. These may be used alone or in combination with each other. In some embodiments, the first sub-power supply wire 361 may have a multilayer structure including a plurality of layers. In some exemplary embodiments, the first sub-power supply wire 361 may be located at the same layer as the source and drain electrodes 210 and 230.

The first planarization layer 270 may be disposed on the second interlayer insulating layer 195, the first sub-power supply wire 361, the source electrode 210, and the drain electrode 230. The first planarization layer 270 may extend to the peripheral region 20 and cover the source electrode 210 and the drain electrode 230 in the display region 10, which are on (e.g., at least partially on) the second interlayer insulating layer 195. In some exemplary embodiments, the first planarization layer 270 may have the first opening 1281 that exposes a top surface of the first sub-power supply wire 361 in the first straight region 81 and the second opening 1282 that exposes the top surface of the first sub-power supply wire 361 in the second straight region 82 (e.g., see FIGS. 15, 16, 17, 19, and 20). As shown in FIGS. 19 and 20, the first sub-power supply wire 361 and the second sub-power supply wire 362 may make direct contact with each other through the opening 1280.

The second sub-power supply wire 362 may be disposed on the first planarization layer 270 in the peripheral region 20. In some exemplary embodiments, the second sub-power supply wire 362 may be electrically connected to the first sub-power supply wire 361 through the opening 1280. Accordingly, the low power supply voltage applied to the first sub-power supply wire 361 may be provided to the second sub-power supply wire 362, and the low power supply voltage may be provided to the upper electrode 340. The second sub-power supply wire 362 may include a metal, an alloy, metal nitride, conductive metal oxide, a transparent conductive material, and the like. These may be used alone or in combination with each other. In some embodiments, the second sub-power supply wire 362 may have a multi-layer structure including a plurality of layers. In some exemplary embodiments, the wiring pattern 215, the connection pattern 235, and the second sub-power supply wire 362 may be located at the same layer.

The power supply wire 350 may include the first sub-power supply wire 361 and the second sub-power supply wire 362.

In some exemplary embodiments, the first straight portion of each of the fan-out wires 1500 is disposed in the first straight region 81 and the second straight region 82, so that the interval between the fan-out wires 1500 may be relatively increased. In this case, because a V-shaped stepped portion is not generated, the second sub-power supply wire 362 may be relatively less affected by the profile of the fan-out wires 1500 in the first straight region 81 and the second straight region 82, and cracks may not be generated in the second sub-power supply wire 362 formed in the opening 1280.

In the organic light emitting diode display device 700 according to the exemplary embodiments of the present invention, because the first opening 1281 located in the current concentration region has a relatively large area, a contact area of the first sub-power supply wire 361 and the second sub-power supply wire 362 is relatively increased, so that a contact resistance may be reduced, and the heat generation phenomenon may not occur in the current concentration region. Accordingly, a defect of the organic light emitting diode display device 700 can be prevented or likelihood thereof may be substantially reduced.

FIGS. 21 to 29 are cross-sectional views illustrating a method of manufacturing an organic light emitting diode display device according to some exemplary embodiments of the present invention.

Figure 21:
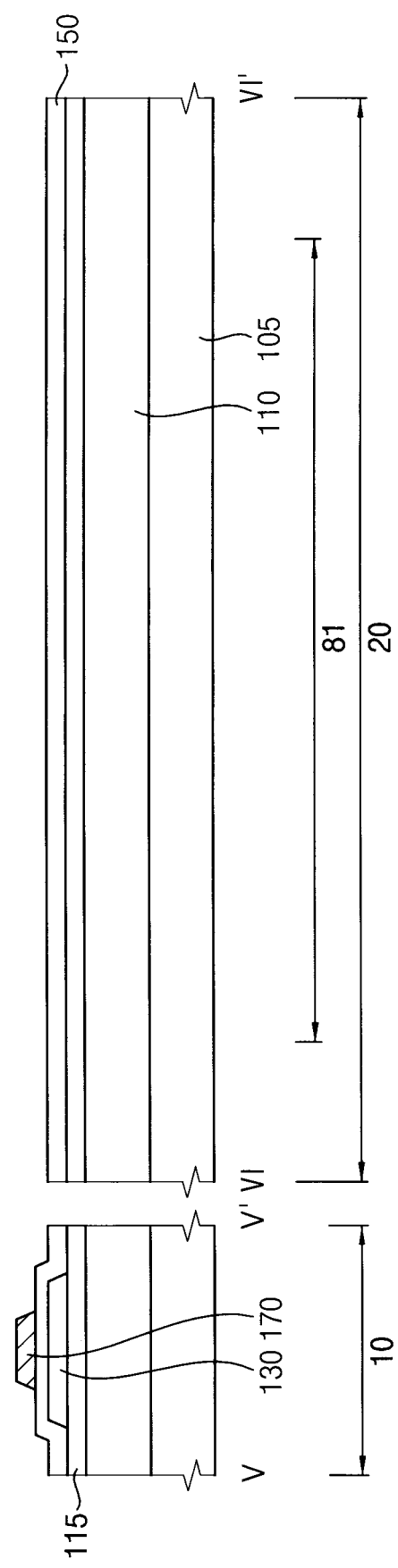
FIGS. 21-29 are cross-sectional views illustrating a method of manufacturing an organic light emitting diode display device according to some exemplary embodiments of the present invention.

Referring to FIGS. 10, 11, and 21, a rigid glass substrate 105 may be provided. The substrate 110 including transparent or opaque materials may be formed on the glass substrate 105. The substrate 110 may be formed by using a transparent resin substrate having flexibility. In some exemplary embodiments, the substrate 110 may have a configuration in which a first organic layer, a first barrier layer, a second organic layer, and a second barrier layer are sequentially stacked. The first barrier layer and the second barrier layer may include an inorganic material such as silicon oxide, and may prevent or substantially prevent water and/or moisture from penetrating through the first and second organic layers. In addition, the first organic layer and the second organic layer may include an organic material such as a polyimide-based resin, and may have flexibility.

The buffer layer 115 may be formed on the substrate 110. The buffer layer 115 may be formed over the display region 10 and the peripheral region 20 and on the substrate 110. The buffer layer 115 may prevent or substantially prevent metal atoms or impurities from diffusing from the substrate 110, and may control a heat transfer rate during a crystallization process for forming the active layer to obtain a substantially uniform active layer. In addition, when a surface of the substrate 110 is not uniform (e.g., not flat), the buffer layer 115 may serve to improve (e.g., increase) the flatness of the surface of the substrate 110. Depending on a type of substrate 110, at least two buffer layers 115 may be provided on the substrate 110, or the buffer layer 115 may not be formed. The buffer layer 115 may be formed by using a silicon compound, metal oxide, and/or the like. For example, the buffer layer 115 may include silicon oxide, silicon nitride, silicon oxynitride, silicon oxycarbide, silicon carbonitride, aluminum oxide, aluminum nitride, tantalum oxide, hafnium oxide, zirconium oxide, titanium oxide, and/or the like.

The active layer 130 may be formed on the buffer layer 115 in the display region 10. The active layer 130 may be formed by using an oxide semiconductor, an inorganic semiconductor, an organic semiconductor, and/or the like. The active layer 130 may have a source region, a drain region, and a channel region located between the source region and the drain region.

The gate insulating layer 150 may be formed on the active layer 130. The gate insulating layer 150 may extend from the display region 10 to the peripheral region 20 to cover the active layer 130, which is on the buffer layer 115 in the display region 10. For example, the gate insulating layer 150 may be formed along a profile of the active layer 130 with a uniform (or substantially uniform) thickness to cover the active layer 130, which is on the buffer layer 115. The gate insulating layer 150 may be formed by using a silicon compound, metal oxide, and/or the like. In other exemplary embodiments, the gate insulating layer 150 may have a multilayer structure having a plurality of insulating layers including materials, which are different from each other.

The first gate electrode 170 may be formed on the gate insulating layer 150 in the display region 10. The first gate electrode 170 may be formed on a portion of the gate insulating layer 150 under which the active layer 130 is located (e.g., to overlap the channel region of the active layer 130). The first gate electrode 170 may be formed by using a metal, an alloy, metal nitride, conductive metal oxide, a transparent conductive material, and the like. These may be used alone or in combination with each other. In other exemplary embodiments, the first gate electrode 170 may have a multilayer structure including a plurality of layers.

As shown in FIGS. 10 and 11, the first, third, and fifth fan-out wires 501, 503, and 505 (e.g., the lower fan-out wires) may be formed on the gate insulating layer 150 in the peripheral region 20. The lower fan-out wires may be spaced apart from each other. Each of the lower fan-out wires may include a metal, an alloy, metal nitride, conductive metal oxide, a transparent conductive material, and the like. These may be used alone or in combination with each other. In some exemplary embodiments, the first gate electrode 170 and the lower fan-out wires may be simultaneously (or concurrently) formed by using the same material. For example, after a first preliminary electrode layer is formed over the gate insulating layer 150, the first preliminary electrode layer may be partially etched to simultaneously (or concurrently) form the first gate electrode 170 and the lower fan-out wires. In other exemplary embodiments, each of the lower fan-out wires may have a multilayer structure including a plurality of layers.

Figure 22:
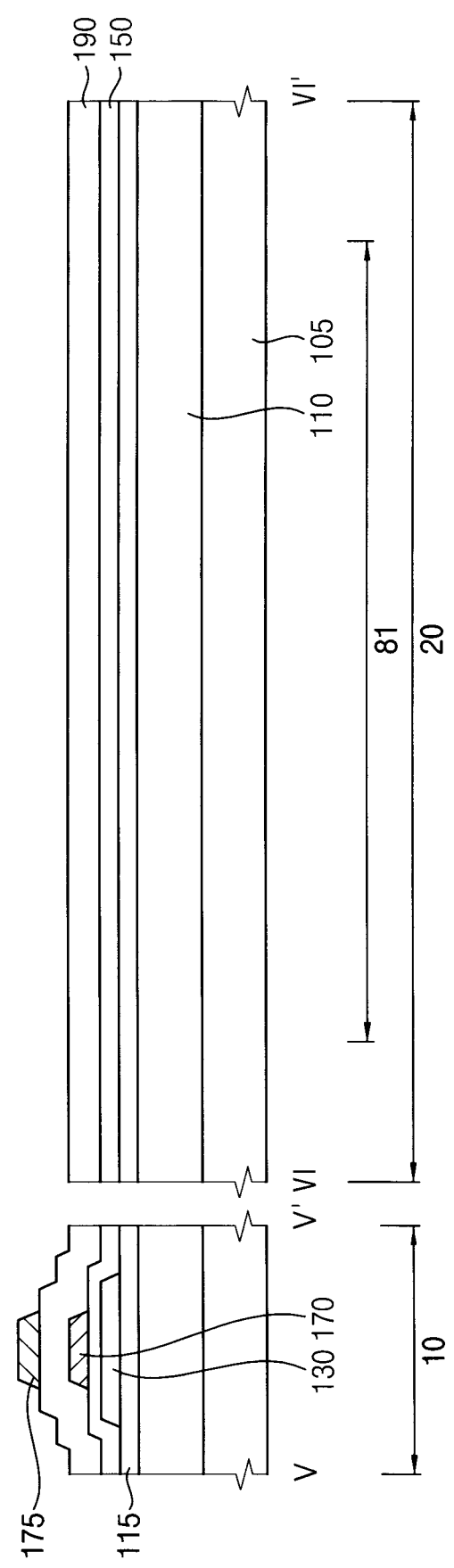

Referring to FIGS. 10, 11, and 22, the first interlayer insulating layer 190 may be formed on the first gate electrode 170 and the lower fan-out wires. The first interlayer insulating layer 190 may extend from the display region 10 to the peripheral region 20 to cover the first gate electrode 170, which is on the gate insulating layer 150 in the display region 10. In addition, the first interlayer insulating layer 190 may cover the lower fan-out wires, which are on the gate insulating layer 150 in the peripheral region 20. In some exemplary embodiments, the first interlayer insulating layer 190 may be formed along a profile of the first gate electrode 170 and the lower fan-out wires with a uniform (or substantially uniform) thickness to cover the first gate electrode 170 and the lower fan-out wires, which are on the gate insulating layer 150. The first interlayer insulating layer 190 may be formed by using a silicon compound, metal oxide, and/or the like. In other exemplary embodiments, the first interlayer insulating layer 190 may have a multilayer structure having a plurality of insulating layers including materials, which are different from each other.

The second gate electrode 175 may be formed on the first interlayer insulating layer 190 in the display region 10. The second gate electrode 175 may be formed on a portion of the first interlayer insulating layer 190 under which the first gate electrode 170 is located. The second gate electrode 175 may be formed by using a metal, an alloy, metal nitride, conductive metal oxide, a transparent conductive material, and the like. These may be used alone or in combination with each other. In other exemplary embodiments, the second gate electrode 175 may have a multilayer structure including a plurality of layers.

The second, fourth, and sixth fan-out wires 502, 504, and 506 (e.g., the upper fan-out wires) may be formed on the first interlayer insulating layer 190 in the peripheral region 20. The upper fan-out wires may be spaced apart from each other without overlapping the lower fan-out wires. The upper fan-out wires may be spaced apart from each other. Each of the lower fan-out wires may include a metal, an alloy, metal nitride, conductive metal oxide, a transparent conductive material, and the like. These may be used alone or in combination with each other. In some exemplary embodiments, the second gate electrode 175 and the upper fan-out wires may be simultaneously (or concurrently) formed by using the same material. For example, after a second preliminary electrode layer is formed over the first interlayer insulating layer 190, the second preliminary electrode layer may be partially etched to simultaneously (or concurrently) form the second gate electrode 175 and the upper fan-out wires. In other exemplary embodiments, each of the upper fan-out wires may have a multilayer structure including a plurality of layers.

Accordingly, the fan-out wires 500 including the first, third, and fifth fan-out wires 501, 503, and 505 and the second, fourth, and sixth fan-out wires 502, 504, and 506 may be formed.

Figure 23:
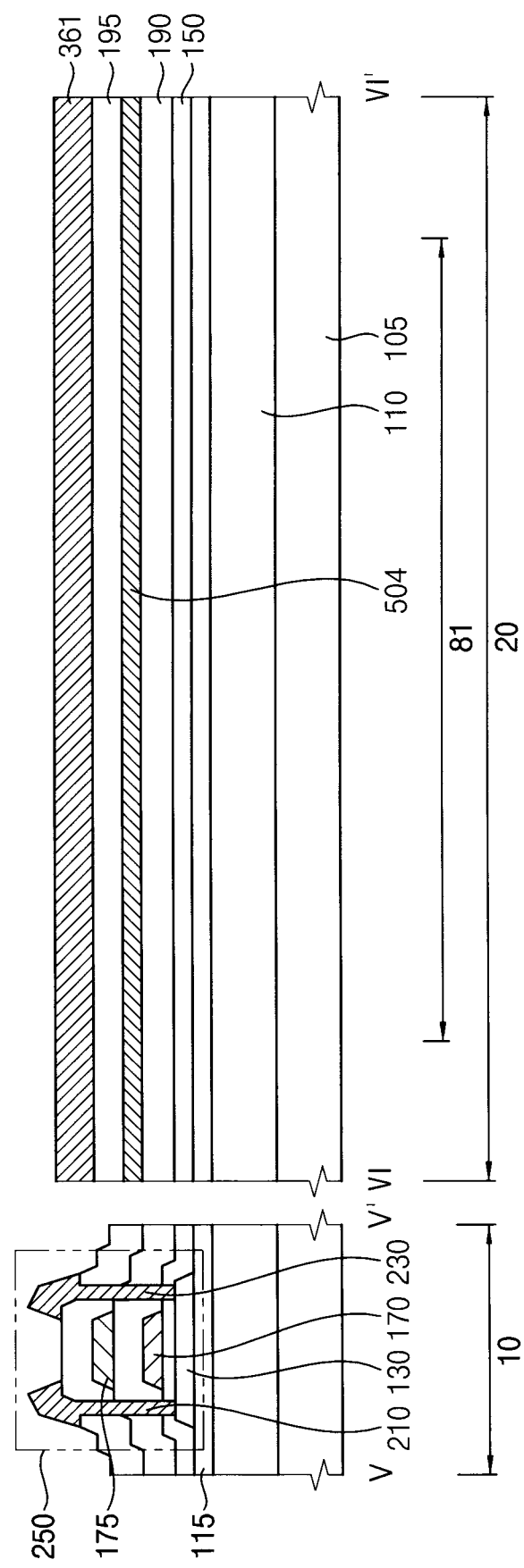

Referring to FIG. 23, the second interlayer insulating layer 195 may be formed on the second gate electrode 175 and the upper fan-out wires. The second interlayer insulating layer 195 may extend from the display region 10 to the peripheral region 20 and cover the second gate electrode 175, which is on the first interlayer insulating layer 190 in the display region 10. In addition, the second interlayer insulating layer 195 may cover the upper fan-out wires, which are on the first interlayer insulating layer 190 in the peripheral region 20. In some exemplary embodiments, the second interlayer insulating layer 195 may be formed along a profile of the second gate electrode 175 and the upper fan-out wires with a uniform (or substantially uniform) thickness to cover the second gate electrode 175 and the upper fan-out wires, which are on the first interlayer insulating layer 190. The second interlayer insulating layer 195 may be formed by using a silicon compound, a metal oxide, and/or the like.

The source electrode 210 and the drain electrode 230 may be formed in the sub-pixel circuit region 30 and on the second interlayer insulating layer 195. The source electrode 210 may be connected to the source region of the active layer 130 through a contact hole (or contact opening) formed by removing first portions of the gate insulating layer 150, the first interlayer insulating layer 190, and the second interlayer insulating layer 195, and the drain electrode 230 may be connected to the drain region of the active layer 130 through a contact hole (or contact opening) formed by removing second portions of the gate insulating layer 150, the first interlayer insulating layer 190, and the second interlayer insulating layer 195. Each of the source electrode 210 and the drain electrode 230 may be formed by using a metal, an alloy, metal nitride, conductive metal oxide, a transparent conductive material, and the like. These may be used alone or in combination with each other. In other exemplary embodiments, each of the source electrode 210 and the drain electrode 230 may have a multilayer structure including a plurality of layers.

Accordingly, the semiconductor element 250 including the active layer 130, the gate insulating layer 150, the first gate electrode 170, the first interlayer insulating layer 190, the second gate electrode 175, the second interlayer insulating layer 195, the source electrode 210, and the drain electrode 230 may be formed.

The first sub-power supply wire 361 may be formed in the peripheral region 20 and on the second interlayer insulating layer 195. In some exemplary embodiments, the first sub-power supply wire 361 may be formed on and along a profile of the second interlayer insulating layer 195 with a uniform (or substantially uniform) thickness to cover the second interlayer insulating layer 195 in the peripheral region 20. The first sub-power supply wire 361 may be formed by using a metal, an alloy, metal nitride, conductive metal oxide, a transparent conductive material, and/or the like. For example, the first sub-power supply wire 361 may include gold, silver, aluminum, platinum, nickel, titanium, palladium, magnesium, calcium, lithium, chromium, tantalum, tungsten, copper, molybdenum, scandium, neodymium, iridium, an aluminum-containing alloy, aluminum nitride, a silver-containing alloy, tungsten nitride, a copper-containing alloy, a molybdenum-containing alloy, titanium nitride, chromium nitride, tantalum nitride, strontium ruthenium oxide, zinc oxide, indium tin oxide, tin oxide, indium oxide, gallium oxide, indium zinc oxide, and the like. These may be used alone or in combination with each other. In some exemplary embodiments, the first sub-power supply wire 361 may be located at the same layer as the source and drain electrodes 210 and 230. For example, after a third preliminary electrode layer is formed over the second interlayer insulating layer 195, the third preliminary electrode layer may be partially etched to simultaneously (or concurrently) form the first sub-power supply wire 361 and the source and drain electrodes 210 and 230. In other exemplary embodiments, the first sub-power supply wire 361 may have a multilayer structure including a plurality of layers.

Figure 24:
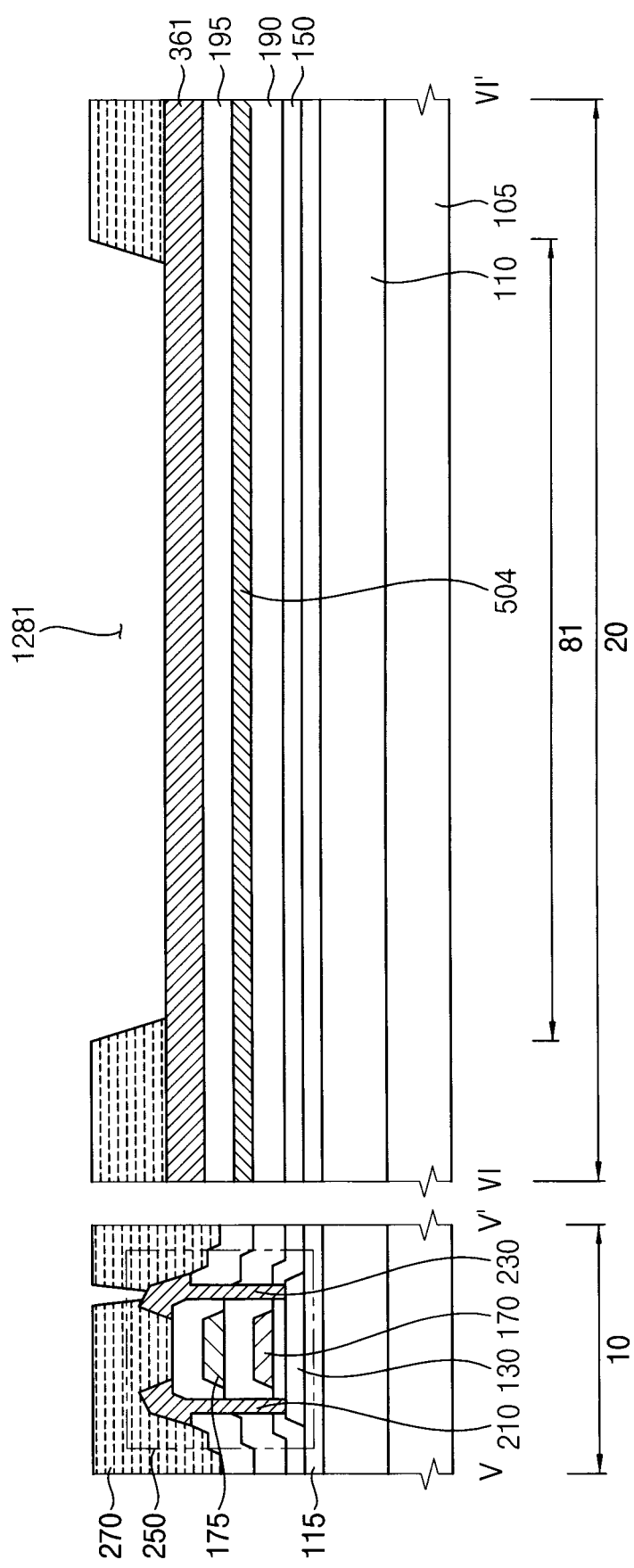
Figure 25:
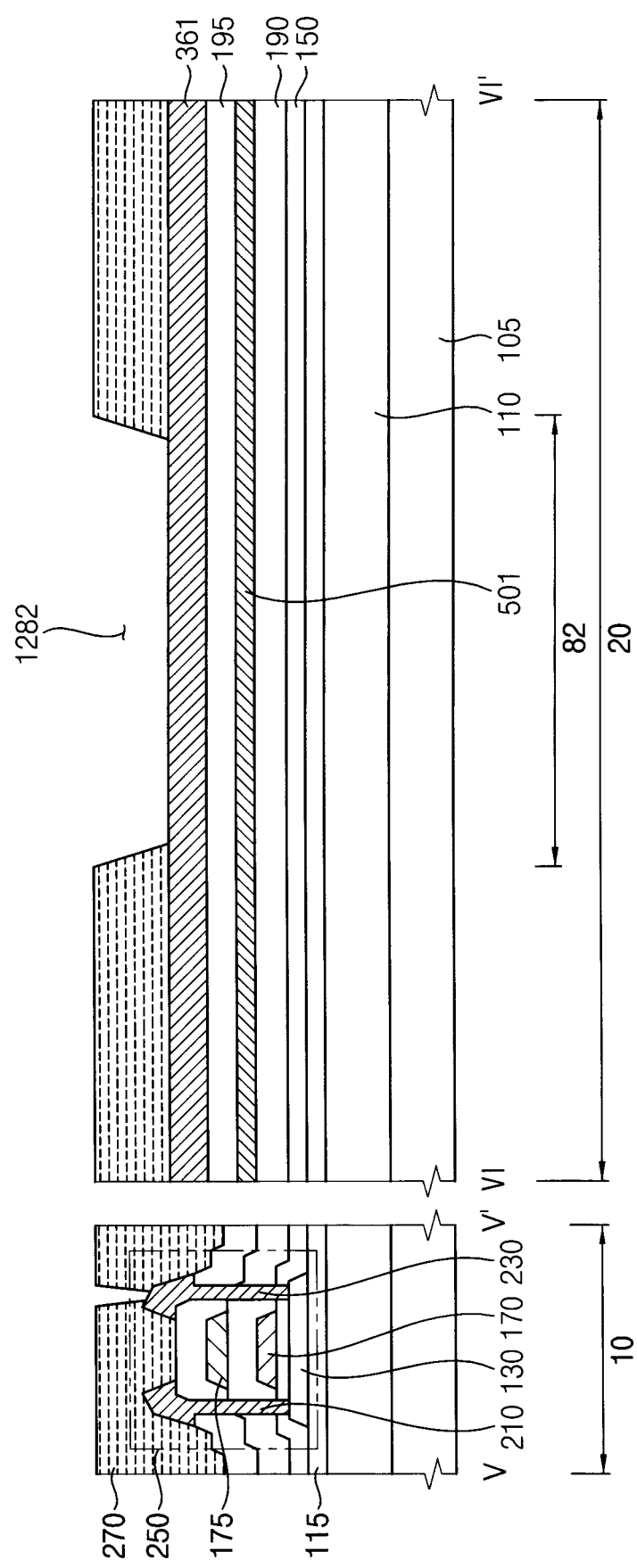

Referring to FIGS. 24 and 25, the first planarization layer 270 may be formed on the second interlayer insulating layer 195, the first sub-power supply wire 361, the source electrode 210, and the drain electrode 230. The first planarization layer 270 may extend to the peripheral region 20 and cover the source electrode 210 and the drain electrode 230 in the display region 10, which are on (e.g., at least partially on) the second interlayer insulating layer 195. In some exemplary embodiments, the first planarization layer 270 may be formed with the first opening 1281 that exposes a top surface of the first sub-power supply wire 361 in the first straight region 81 and the second opening 1282 that exposes the top surface of the first sub-power supply wire 361 in the second straight region 82.

For example, the first planarization layer 270 may be formed in the display region 10 and the peripheral region 20 with a relatively large thickness. In this case, the first planarization layer 270 may have a substantially flat top surface. To implement such a flat top surface of the first planarization layer 270, a planarization process may be additionally performed on the first planarization layer 270. The first planarization layer 270 may be formed by using an organic material. For example, the first planarization layer 270 may include a photoresist, a polyacryl-based resin, a polyimide-based resin, a polyamide-based resin, a siloxane-based resin, an acryl-based resin, an epoxy-based resin, and/or the like.

Figure 26:
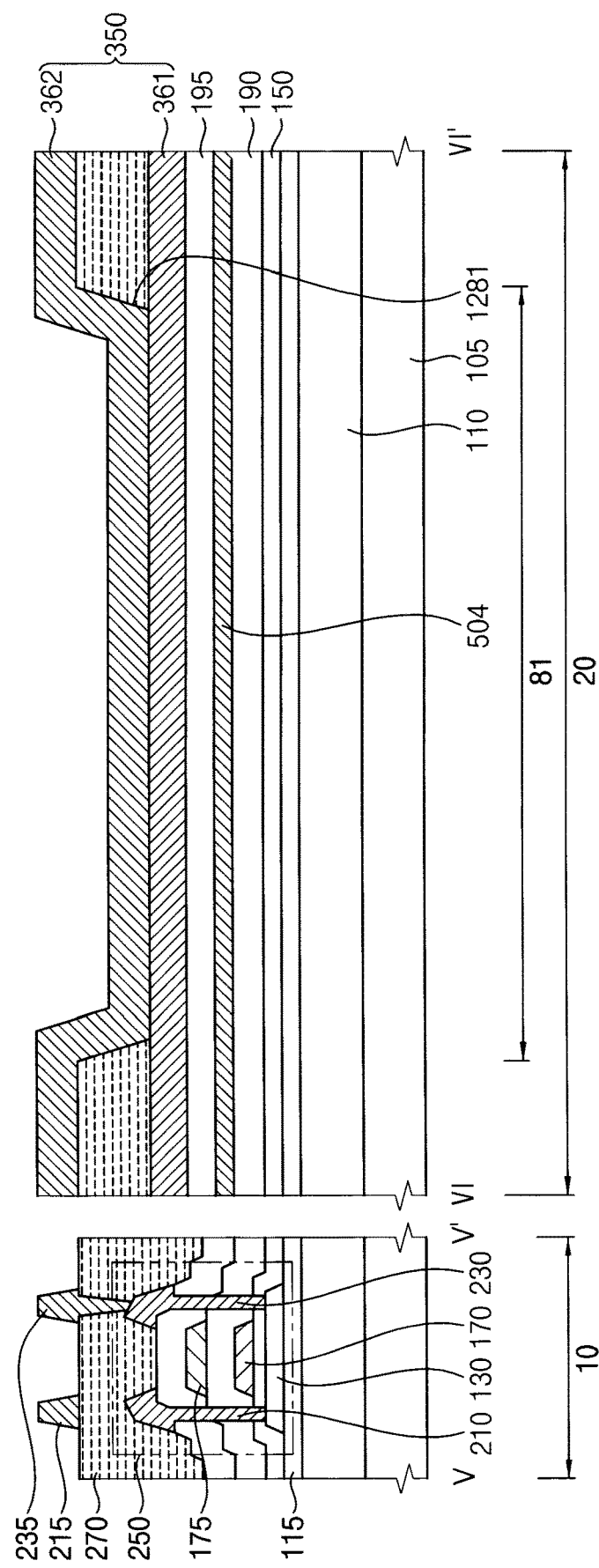
Figure 27:
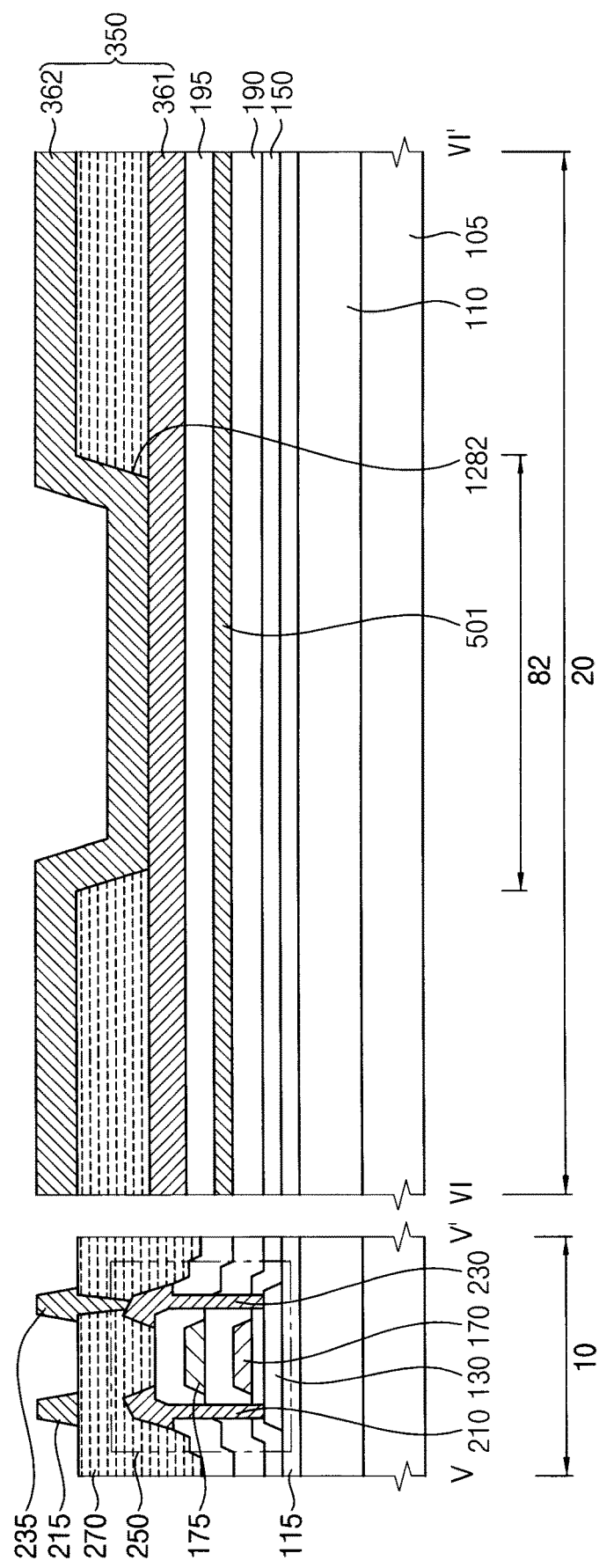

Referring to FIG. 26, the wiring pattern 215 and the connection pattern 235 may be formed on the first planarization layer 270 in the display region 10. The wiring pattern 215 may transfer the gate signal, the data signal, the light emission control signal, the gate initialization signal, the power supply voltage, and/or the like. The connection pattern 235 may be spaced apart from the wiring pattern 215, which is on the first planarization layer 270 in the display region 10. The connection pattern 235 may be connected to the drain electrode 230 through a contact hole (or contact opening) formed by removing a portion of the first planarization layer 270 located in the display region 10, and the connection pattern 235 may electrically connect the lower electrode 290 to the drain electrode 230. Each of the wiring pattern 215 and the connection pattern 235 may be formed by using a metal, an alloy, metal nitride, conductive metal oxide, a transparent conductive material, and the like. These may be used alone or in combination with each other. In other exemplary embodiments, each of the wiring pattern 215 and the connection pattern 235 may have a multilayer structure including a plurality of layers.

The second sub-power supply wire 362 may be formed on the first planarization layer 270 in the peripheral region 20. In some exemplary embodiments, the second sub-power supply wire 362 may make direct contact with the first sub-power supply wire 361 through the opening 1280. The second sub-power supply wire 362 may be formed by using a metal, an alloy, metal nitride, conductive metal oxide, a transparent conductive material, and the like. These may be used alone or in combination with each other. In some exemplary embodiments, the wiring pattern 215, the connection pattern 235, and the second sub-power supply wire 362 may be simultaneously (or concurrently) formed by using the same material. For example, after a fourth preliminary electrode layer is formed over the first planarization layer 270, the fourth preliminary electrode layer may be partially etched to simultaneously (or concurrently) form the wiring pattern 215, the connection pattern 235, and the second sub-power supply wire 362. In other exemplary embodiments, the second sub-power supply wire 362 may have a multilayer structure including a plurality of layers.

Accordingly, the power supply wire 350 including the first sub-power supply wire 361 and the second sub-power supply wire 362 may be formed.

Figure 28:
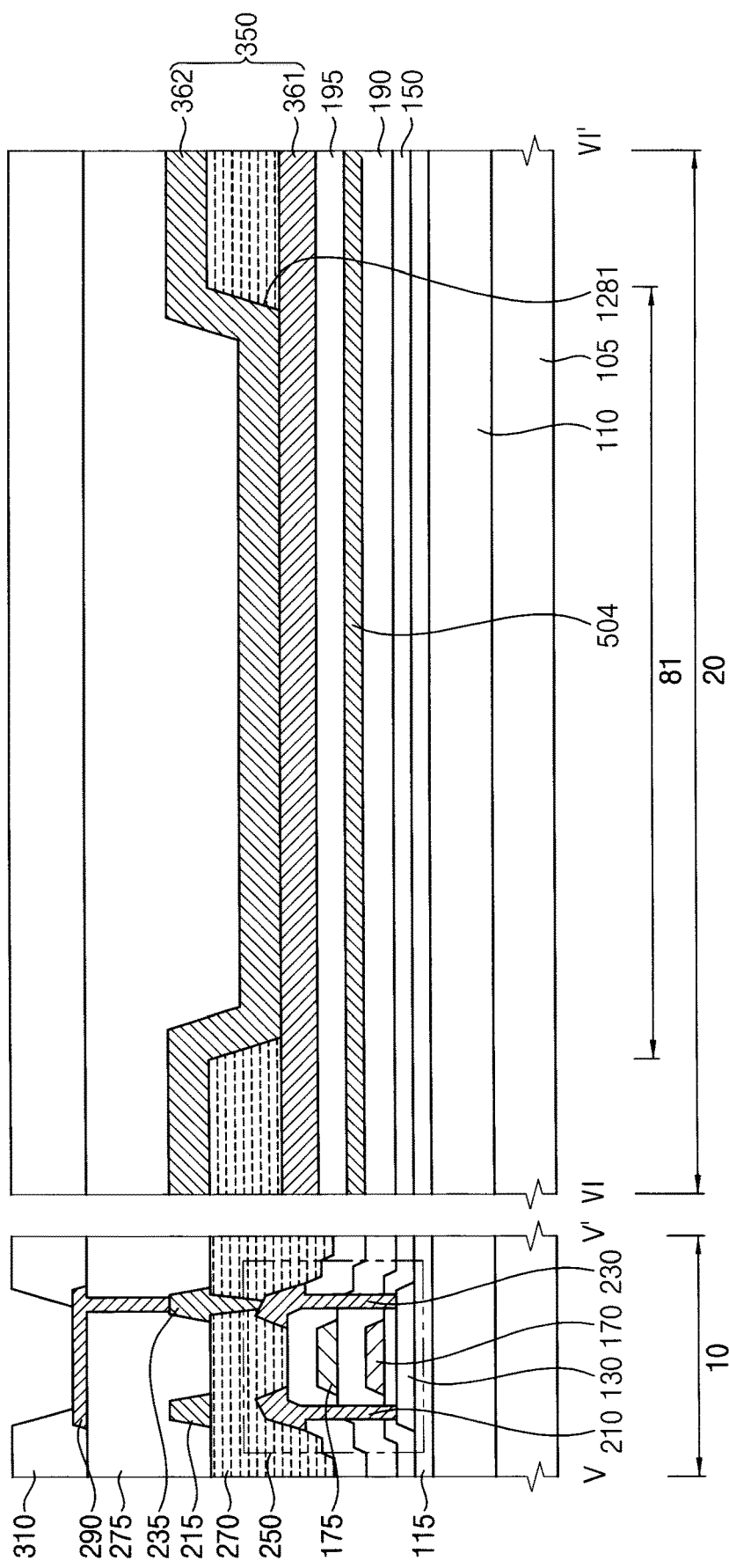

Referring to FIG. 28, the second planarization layer 275 may be formed on the wiring pattern 215, the connection pattern 235, the second sub-power supply wire 362, and the first planarization layer 270. The second planarization layer 275 may extend from the display region 10 to the peripheral region 20 and cover the wiring pattern 215 and the connection pattern 235 in the display region 10, which are on the first planarization layer 270, and may cover the second sub-power supply wire 362 in the peripheral region 20. In other words, the second planarization layer 275 may be formed over the substrate 110.

The second planarization layer 275 may have a relatively large thickness to cover the wiring pattern 215, the connection pattern 235, and the second sub-power supply wire 362. In this case, the second planarization layer 275 may have a substantially flat top surface. To implement such a flat top surface of the second planarization layer 275, the planarization process may be additionally performed on the second planarization layer 275. The second planarization layer 275 may be formed by using an organic material.

The lower electrode 290 may be formed on the second planarization layer 275 in the display region 10. The lower electrode 290 may be connected to the connection pattern 235 through a contact hole (or contact opening) formed by removing a portion of the second planarization layer 275. The lower electrode 290 may be formed by using a metal, an alloy, metal nitride, conductive metal oxide, a transparent conductive material, and the like. These may be used alone or in combination with each other. In other exemplary embodiments, the lower electrode 290 may have a multilayer structure including a plurality of layers.

The pixel defining layer 310 may be formed on the second planarization layer 275 in the display region 10, and may extend from the display region 10 to the peripheral region 20 while exposing a portion of the lower electrode 290. The pixel defining layer 310 may be formed by using an organic material.

The light emitting layer 330 may be formed on the lower electrode 290 that is partially exposed by the pixel defining layer 310. The light emitting layer 330 may be formed by using at least one of light emitting materials for emitting different color lights (e.g., red light, green light, blue light, etc.) corresponding to the sub-pixels.

Figure 29:
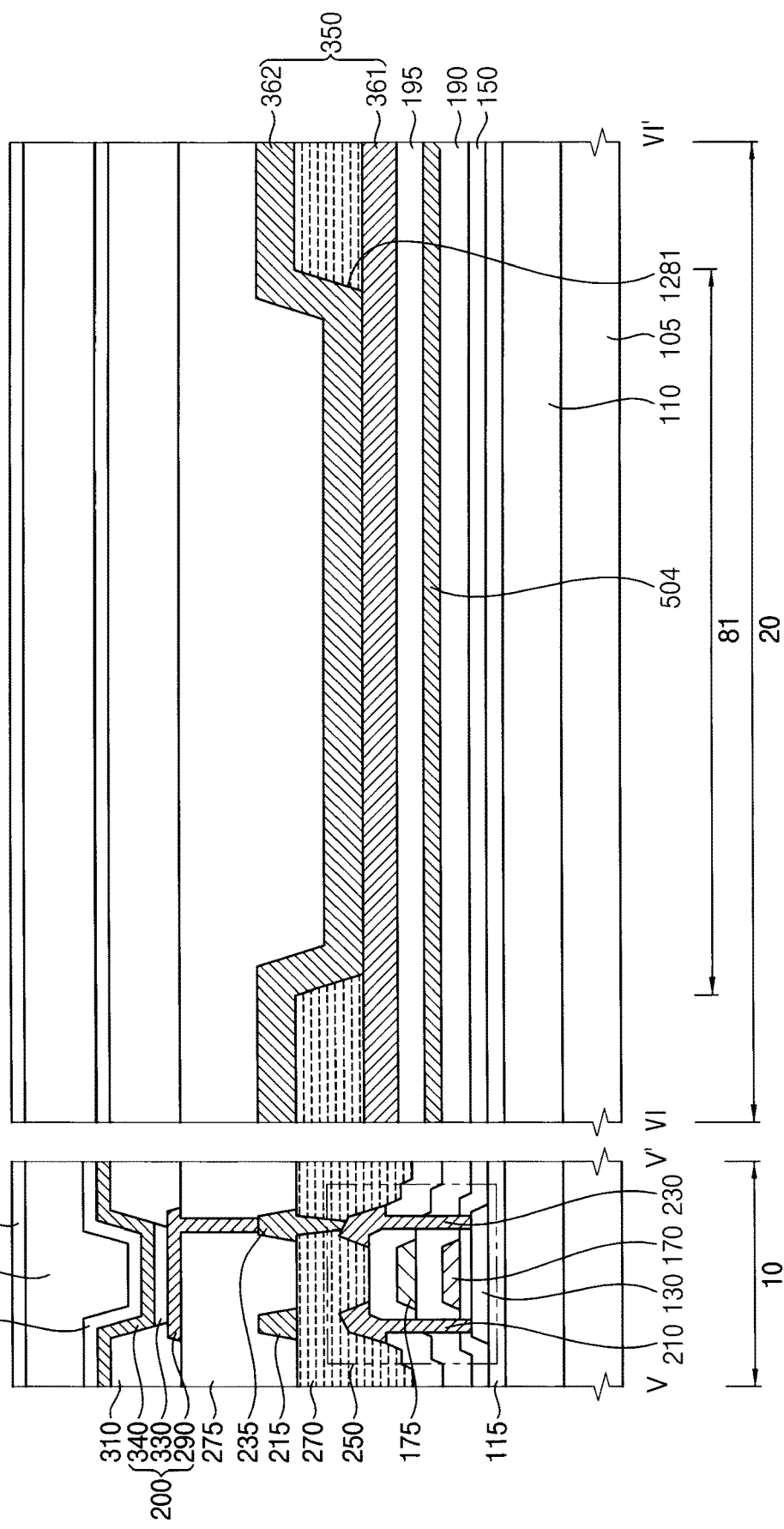

Referring to FIG. 29, the upper electrode 340 may be formed on the pixel defining layer 310 and the light emitting layer 330 in the display region 10. The upper electrode 340 may be formed by using a metal, an alloy, metal nitride, conductive metal oxide, a transparent conductive material, and the like. These may be used alone or in combination with each other. In other exemplary embodiments, the upper electrode 340 may have a multilayer structure including a plurality of layers.

Accordingly, the sub-pixel structure 200 including the lower electrode 290, the light emitting layer 330, and the upper electrode 340 may be formed.

The first thin film encapsulation layer 451 may be formed on the upper electrode 340 in the display region 10, and on the pixel defining layer 310 the peripheral region 20. The first thin film encapsulation layer 451 may be formed along a profile of the upper electrode 340 with a uniform (or substantially uniform) thickness to cover the upper electrode 340 in the display region 10, and may be formed along a profile of the pixel defining layer 310 with a uniform thickness to cover the pixel defining layer 310 in the peripheral region 20. The first thin film encapsulation layer 451 may be formed by using inorganic materials having flexibility.

The second thin film encapsulation layer 452 may be formed on the first thin film encapsulation layer 451 in the display region 10 and the peripheral region 20. The second thin film encapsulation layer 452 may be formed by using organic materials having flexibility.

The third thin film encapsulation layer 453 may be formed on the second thin film encapsulation layer 452 in the display region 10 and the peripheral region 20. The third thin film encapsulation layer 453 may be formed along a profile of the second thin film encapsulation layer 452 with a uniform thickness to cover the second thin film encapsulation layer 452. The third thin film encapsulation layer 453 may be formed by using inorganic materials having flexibility.

Accordingly, the thin film encapsulation structure 450 including the first thin film encapsulation layer 451, the second thin film encapsulation layer 452, and the third thin film encapsulation layer 453 may be formed.

After the thin film encapsulation structure 450 is formed, the glass substrate 105 may be removed from the substrate 110. Accordingly, the organic light emitting diode display device 700 shown in FIGS. 13 to 20 may be manufactured.

The present invention may be applied to various display devices including an OLED display device. For example, the present invention may be applied to vehicle-display devices, ship-display devices, aircraft-display devices, portable communication devices, display devices for display or for information transfer, medical-display devices, and/or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

The organic light emitting diode display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the organic light emitting diode display device may be formed on one integrated circuit (IC) chip or on separate IC chips. Further, the various components of the organic light emitting diode display device may be implemented on a flexible printed circuit film, a tape carrier package (TCP), a printed circuit board (PCB), or formed on a same substrate. Further, the various components of the organic light emitting diode display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and features of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the present inventive concept as defined by the claims and equivalents thereof.

What is claimed is:

1. An organic light emitting diode display device comprising:
   a substrate having a display region, a peripheral region around the display region, and a pad region located on one side of the peripheral region;
   a sub-pixel structure in the display region on the substrate;
   a plurality of fan-out wires on the substrate and located in the peripheral region, each one of the fan-out wires comprising a first diagonal portion, a first straight portion, and a second diagonal portion;
   a first sub-power supply wire on the fan-out wires and located in the peripheral region; and
   a first planarization layer on the first sub-power supply wire and having an opening configured to expose the first sub-power supply wire on a portion at which the first straight portion of each of the fan-out wires is located, the opening extending lengthwise and continuously from one side of the display region to an opposite side of the display region.

2. The organic light emitting diode display device of claim 1, wherein the opening at least partially surrounds the display region.

3. The organic light emitting diode display device of claim 1, further comprising a second sub-power supply wire overlapping the first sub-power supply wire in the peripheral region and located on the first planarization layer, the second sub-power supply wire making contact with the first sub-power supply wire through the opening,
   wherein the first sub-power supply wire and the second sub-power supply wire constitute a power supply wire.

4. The organic light emitting diode display device of claim 3, further comprising a plurality of pad electrodes on the substrate and located in a portion of the pad region on the substrate,
   wherein the peripheral region comprises:
      a first peripheral region between the pad region and the display region in correspondence with the pad electrodes; and
      a second peripheral region corresponding to a remaining portion of the peripheral region and located outside of the first peripheral region.

5. The organic light emitting diode display device of claim 4, wherein the fan-out wires are in the first peripheral region and a portion of the second peripheral region.

6. The organic light emitting diode display device of claim 4, wherein the first diagonal portion is adjacent to the pad electrodes,
   wherein the second diagonal portion is adjacent to the sub-pixel structure,
   wherein the first straight portion is located between the first and second diagonal portions, and
   wherein the first diagonal portion, the first straight portion, and the second diagonal portion are integrally formed.

7. The organic light emitting diode display device of claim 4, wherein the power supply wire comprises:
   a first wire portion adjacent to the pad electrodes in the first peripheral region and located on the substrate; and
   a second wire portion located in a portion of the first peripheral region and the second peripheral region and on the substrate, and
   wherein the power supply wire has a frame shape with an open bottom.

8. The organic light emitting diode display device of claim 7, wherein the first and second wire portions are integrally formed, and
   wherein the first and second wire portions at least partially surround the display region.

9. The organic light emitting diode display device of claim 8, wherein the opening is located along an outer profile of the second wire portion without being located in the first wire portion.

10. The organic light emitting diode display device of claim 9, wherein the opening comprises:
    a first opening at a first outer peripheral portion of the second wire portion that is adjacent to the first wire portion, the first opening having a first width; and
    a second opening at a second outer peripheral portion of the second wire portion that is not adjacent to the first wire portion, the second opening having a second width less than the first width.

11. The organic light emitting diode display device of claim 10, wherein the first opening and the second opening are integrally formed.

12. The organic light emitting diode display device of claim 10, wherein the fan-out wires comprise:
    first fan-out wires overlapping the first opening; and
    second fan-out wires overlapping the second opening, and
    wherein a length of the first straight portion in each of the first fan-out wires is longer than a length of the first straight portion in each of the second fan-out wires.

13. The organic light emitting diode display device of claim 12, wherein each of the second fan-out wires further comprises a second straight portion.

14. The organic light emitting diode display device of claim 13, wherein the first diagonal portion of each of the second fan-out wires comprises:

an upper diagonal portion connected to the first straight portion; and a lower diagonal portion adjacent to the pad electrodes, wherein the second straight portion is between the upper diagonal portion and the lower diagonal portion, and wherein the upper diagonal portion, the second straight portion, and the lower diagonal portion are integrally formed.

15. The organic light emitting diode display device of claim 3, wherein the sub-pixel structure comprises:

a lower electrode in the display region and located on the first planarization layer;

a light emitting layer on the lower electrode; and an upper electrode on the light emitting layer, wherein a low power supply voltage is applied to the power supply wire, and wherein the low power supply voltage is provided to the upper electrode.

16. The organic light emitting diode display device of claim 1, wherein a length of the first straight portion is shorter than a length of each of the first and second diagonal portions.

17. The organic light emitting diode display device of claim 1, wherein at least two fan-out wires of the plurality of fan-out wires are under a portion overlapping with the opening in the peripheral region.

18. The organic light emitting diode display device of claim 1, wherein the fan-out wires comprise first to $N^{th}$ fan-out wires (where N is an integer greater than or equal to 2), and wherein a $K^{th}$ fan-out wire and a $(K+1)^{th}$ fan-out wire from among the first to $N^{th}$ fan-out wires are on mutually different layers (where K is an integer between 1 and N).

19. The organic light emitting diode display device of claim 18, further comprising:

a semiconductor element in the display region and located between the substrate and the first planarization layer;

connection and wiring patterns in the display region and located on the first planarization layer;

a second planarization layer on the connection and wiring patterns; and a thin film encapsulation structure on the sub-pixel structure.

20. The organic light emitting diode display device of claim 19, wherein the semiconductor element comprises:

an active layer on the substrate;

a first gate electrode on the active layer;

a second gate electrode on the first gate electrode; and source and drain electrodes on the second gate electrode, wherein the $K^{th}$ fan-out wire is at a same layer as the first gate electrode, and wherein the $(K+1)^{th}$ fan-out wire is at a same layer as the second gate electrode, and wherein the first sub-power supply wire is at a same layer as the source and drain electrodes.

* * * * *